United States Patent
Gao et al.

(10) Patent No.: US 11,401,285 B2
(45) Date of Patent: Aug. 2, 2022

(54) COMPOUND, DISPLAY PANEL AND DISPLAY APPARATUS

(71) Applicants: WUHAN TIANMA MICRO-ELECTRONICS CO., LTD., Wuhan (CN); WUHAN TIANMA MICROELECTRONICS CO., LTD., SHANGHAI BRANCH, Shanghai (CN)

(72) Inventors: Wei Gao, Shanghai (CN); Lei Zhang, Shanghai (CN); Wenpeng Dai, Shanghai (CN); Jinghua Niu, Shanghai (CN); Hongyan Zhu, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 258 days.

(21) Appl. No.: 16/653,383

(22) Filed: Oct. 15, 2019

(65) Prior Publication Data
US 2020/0347081 A1    Nov. 5, 2020

(30) Foreign Application Priority Data
Apr. 30, 2019   (CN) .......................... 201910361227.1

(51) Int. Cl.
*H01L 51/50*    (2006.01)
*C07F 5/02*    (2006.01)
(Continued)

(52) U.S. Cl.
CPC ............ *C07F 5/027* (2013.01); *H01L 51/008* (2013.01); *H01L 51/0069* (2013.01);
(Continued)

(58) Field of Classification Search
None
See application file for complete search history.

(56) References Cited

FOREIGN PATENT DOCUMENTS

| CN | 108774258 | * 11/2018 | ............ H01L 51/50 |
| JP | 2001-93670 A | 4/2001 | |

OTHER PUBLICATIONS

First Office Action dated Mar. 16, 2021, in corresponding Chinese Patent Application No. 201910361227.1, including English translation, 11 pages.

* cited by examiner

*Primary Examiner* — Gregory D Clark
(74) *Attorney, Agent, or Firm* — Christensen O'Connor Johnson Kindness PLLC

(57) ABSTRACT

A compound according to Formula (1),

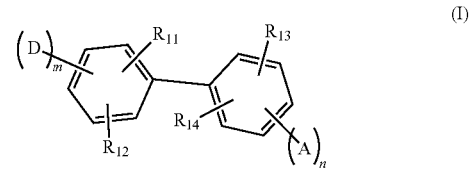

in which D is an electron donor containing a nitrogen atom and is bonded to a benzene ring through the nitrogen atom; A is an electron acceptor containing a boron atom and is bonded to a benzene ring through the boron atom; m and n are each an integer selected from 1, 2 or 3; and $R_{11}$, $R_{12}$, $R_{13}$, $R_{14}$ are each independently selected from the group consisting of a hydrogen atom, alkyl, alkoxy, cyano, trifluoromethyl, an electron acceptor A', and a nitrogen-containing electron donor (Continued)

D. In the compound, biphenyl acts as a linking unit between the electron donor D and the electron acceptor A, such that units D and A are located at different positions of the molecule, realizing effective separation between HOMO and LUMO. In addition, the light absorption and vibration strength of the molecule are enhanced.

18 Claims, 2 Drawing Sheets

(51) Int. Cl.
*H01L 51/00* (2006.01)
*H01L 51/52* (2006.01)
(52) U.S. Cl.
CPC ...... *H01L 51/0072* (2013.01); *H01L 51/5206* (2013.01); *H01L 51/5004* (2013.01); *H01L 51/5016* (2013.01); *H01L 51/5221* (2013.01)

COMPOUND, DISPLAY PANEL AND DISPLAY APPARATUS

CROSS-REFERENCE TO RELATED APPLICATIONS

The present application claims priority to Chinese Patent Application No. 201910361227.1, filed on Apr. 30, 2019, the content of which is incorporated herein by reference in its entirety.

TECHNICAL FIELD

The present disclosure relates to the field of organic electroluminescent materials, and particularly, to compounds having thermally activated delayed fluorescence (TADF) properties and containing an aromatic heterocyclic ring, a display panel containing the compound, and a display apparatus.

BACKGROUND

With the rapid development of electronic display technology, Organic Light-emitting Diode (OLED) is widely used in various display apparatuses, and research on light-emitting materials of OLED is also more intensive.

Based on light-emitting mechanism, materials applicable in a light-emitting layer of the OLED can be mainly divided into four types:

(1) fluorescent materials; (2) phosphorescent materials; (3) triplet-triplet annihilation (TTA) materials; and (4) thermally activated delayed fluorescence (TADF) materials.

With respect to the fluorescent materials, according to spin-statistics, a ratio of singlet excitons to triplet excitons is 1:3, and thus the maximum internal quantum yield of fluorescent materials does not exceed 25%. According to the Lambertian luminescence mode, the light extraction efficiency is about 20%, and thus an external quantum efficiency (EQE) of the OLED based on the fluorescent material does not exceed 5%.

With respect to the phosphorescent materials, an intersystem crossing of molecules can be enhanced due to a heavy atom effect of the phosphorescent materials, and 75% of triplet excitons can be directly utilized to complete emission involving both S1 and T1 at room temperature, where a theoretical maximum internal quantum yield can reach 100%. According to the Lambertian luminescence mode, a light extraction efficiency is about 20%, and thus the EQE of the OLED based on the phosphorescent materials can reach 20%. However, the phosphorescent materials are basically complexes of a heavy metal such as Ir, Pt, Os, Re, Ru, etc., and are unsuitable for a large-scale production due to the high production cost. Under a high electric current density, a substantial efficiency fall can be observed in the phosphorescent materials, which lead to a deterioration of the stability of the phosphorescent devices.

With respect to the TAA materials, two adjacent triplet excitons are combined to form a singlet excited state molecule with higher energy level and a ground state molecule. However, since the two triplet excitons merely produce one singlet state exciton, the theoretical maximum internal quantum yield can only reach 62.5%. In order to prevent the substantial fall of efficiency, a concentration of triplet excitons should be regulated during this process.

For the TADF materials, when an energy level difference between the singlet excited state and the triplet excited state is relatively small, a reverse intersystem crossing (RISC) may occur among the molecules, and the excitons are converted from T1 state to S1 state by absorbing the ambient heat, so that 75% of triplet excitons and 25% of singlet excitons can be utilized at the same time. In this way, the theoretical maximum internal quantum yield can reach 100%. The TADF materials are mainly organic compounds without rare metal element, so that the production cost is relatively low. The TADF materials can be chemically modified by various methods. However, there are few TADF materials that have been discovered so far, and it is urgent to develop new TADF materials applicable in OLED.

SUMMARY

In view of this, a first aspect of the present disclosure provides a compound having a property of thermally activated delayed fluorescence (TADF). The compound has a structure represented by Formula (1):

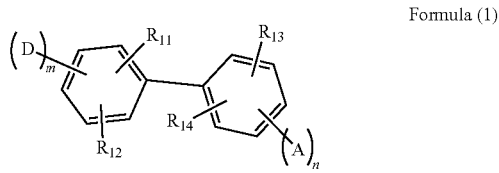

Formula (1)

in which D is an electron donor containing a nitrogen atom and is bonded to a benzene ring through the nitrogen atom, and m is an integer selected from 1, 2 or 3;

A is an electron acceptor containing a boron atom and is bonded to a benzene ring through the boron atom, and n is an integer selected from 1, 2 or 3;

the electron acceptor A has a structure represented by any one of the following Formulas (2-1) and (2-2):

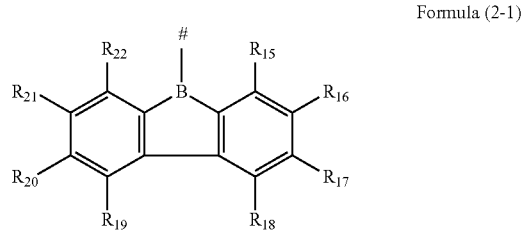

Formula (2-1)

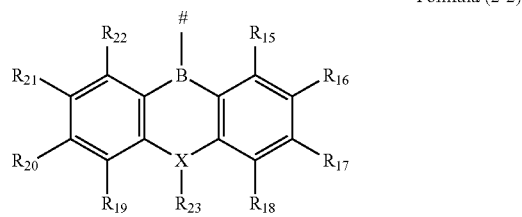

Formula (2-2)

in which $R_{15}$-$R_{23}$ are each independently selected from the group consisting of C1-C20 alkyl, C1-C20 alkoxy, a substituted or unsubstituted C6-C40 aryl, and a substituted or unsubstituted C3-C40 heteroaryl;

X is selected from the group consisting of a boron atom, an oxygen atom, a sulfur atom, and a nitrogen atom, and $R_{23}$ is absent when X is an oxygen atom, and a sulfur atom;

$R_{11}$, $R_{12}$, $R_{13}$, $R_{14}$ are each independently selected from the group consisting of a hydrogen atom, alkyl, alkoxy, cyano, trifluoromethyl, an electron acceptor A', and a nitrogen-containing electron donor D';

the electron acceptor A' is any one of a carbonyl-containing group, a sulfuryl-containing group, a phosphinyl-containing six-membered phosphorus heterocyclic group, a boron-containing heterocyclic group, and an imido-containing group; and the nitrogen-containing electron donor D' is any one of a substituted or unsubstituted C12-C40 diphenylamino, a substituted or unsubstituted C12-C40 carbazolyl and derivative groups thereof, and a substituted or unsubstituted C13-C40 acridinyl and derivative groups thereof.

A second aspect of the present disclosure provides a display panel. The display panel includes an anode; a cathode; and a light-emitting layer disposed between the anode and the cathode. A light-emitting material of the light-emitting layer includes a host material and a guest material, and the host material or the guest material is one or more of compounds according to the first aspect of the present disclosure.

A third aspect of the present disclosure provides a display apparatus including the display panel according to the second aspect of the present disclosure.

DESCRIPTION OF EMBODIMENTS

Figure 1:
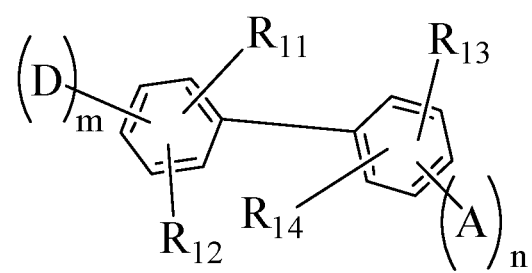
FIG. 1 is a general chemical formula of a compound according to an embodiment of the present disclosure.

The present disclosure is further illustrated by the following embodiments, which are merely intended to describe the present disclosure, and the present disclosure is not limited to the following embodiments.

The first aspect of the present disclosure provides a compound having property of thermally activated delayed fluorescence (TADF). The compound has a structure represented by Formula (1):

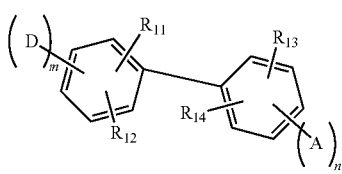

Formula (1)

in which D is an electron donor containing a nitrogen atom and is bonded to a benzene ring through the nitrogen atom, and m is an integer selected from 1, 2 or 3;

A is an electron acceptor containing a boron atom and is bonded to a benzene ring through the boron atom, and n is an integer selected from 1, 2 or 3;

the electron acceptor A has a structure represented by any one of the following Formulas (2-1) and (2-2):

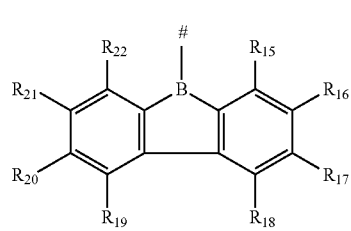

Formula (2-1)

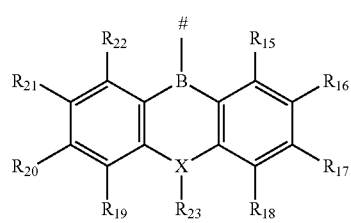

Formula (2-2)

in which $R_{15}$-$R_{23}$ are each independently selected from the group consisting of C1-C20 alkyl, C1-C20 alkoxy, a substituted or unsubstituted C6-C40 aryl, and a substituted or unsubstituted C3-C40 heteroaryl;

X is selected from the group consisting of a boron atom, an oxygen atom, a sulfur atom, and a nitrogen atom, and $R_{23}$ is absent when X is an oxygen atom, and a sulfur atom;

$R_{11}$, $R_{12}$, $R_{13}$, $R_{14}$ are each independently selected from the group consisting of a hydrogen atom, alkyl, alkoxy, cyano, trifluoromethyl, an electron acceptor A', and a nitrogen-containing electron donor D';

the electron acceptor A' is any one of a carbonyl-containing group, a sulfuryl-containing group, a phosphinyl-containing six-membered phosphorus heterocyclic group, a boron-containing heterocyclic group, and an imido-containing group; and the nitrogen-containing electron donor D' is any one of a substituted or unsubstituted C12-C40 diphenylamino, a substituted or unsubstituted C12-C40 carbazolyl and derivative groups thereof, and a substituted or unsubstituted C13-C40 acridinyl and derivative groups thereof.

In the compound of the present disclosure, biphenyl is used as a linking unit between the electron donor D and the electron acceptor A. Such a molecular structure has the following advantages: (1) unit D and unit A are located at different positions of the molecule to effectively separate HOMO from LUMO; (2) the electron donor unit D and the electron acceptor unit A are connected through biphenyl to form two physical processes in the same molecule at the same time, i.e., the intramolecular charge transfer and space charge transfer, thereby enhancing the light absorption and vibration strength of the molecule; (3) by introducing groups $R_{11}$, $R_{12}$, $R_{13}$, and $R_{14}$ in the vicinity of the unit D and the unit A, the electron donor unit D and the electron acceptor unit A can have a larger steric hindrance, which can increase a dihedral angle between the electron donor unit D and the electron acceptor unit A, thereby obtaining a smaller ΔEst; (4) by introducing the modification groups $R_{11}$, $R_{12}$, $R_{13}$, and $R_{14}$ in the vicinity of the unit D and the unit A, the space-limiting effect in the molecule is increased and the positive solvation discoloration effect of the molecule is reduced, while improving the purity of the molecular light-emitting color and achieving a smaller half-peak width; and (5) the electron acceptor A is a boron-containing structural unit, when the aromatic ring is connected to the boron atom, the boron atom can provide a conjugate plane due to its empty p orbital, and the substituent on the aromatic ring can protect the boron atom from being eroded by oxygen and water, so that the whole molecule has better optical properties, narrower half-width, higher color purity. Therefore, it can also be used to synthesize tri-aryl derivatives, and the obtained tri-aryl boron substituents can be used to constitute D-A type of TADF materials.

According to an embodiment of the present disclosure, the compound has a structure represented by Formula (1-1):

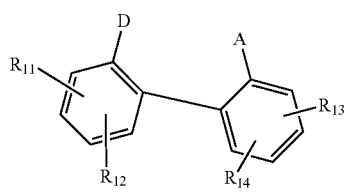

Formula (1-1)

$R_{11}$, $R_{12}$, $R_{13}$ and $R_{14}$ are each independently selected from the group consisting of cyano, trifluoromethyl, alkyl, alkoxy, the electron acceptor A', and the nitrogen-containing electron donor D'.

According to an embodiment of the present disclosure, the compound has a structure represented by Formula (1-2):

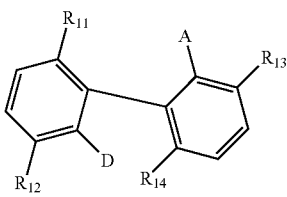

Formula (1-2)

$R_{11}$ and $R_{12}$ are each independently selected from the group consisting of alkyl, alkoxy, and the nitrogen-containing electron donor D'; and $R_{13}$ and $R_{14}$ are each independently selected from the group consisting of alkyl, alkoxy, and electron acceptor A'.

According to an embodiment of the present disclosure, the compound has a structure represented by Formula (1-3):

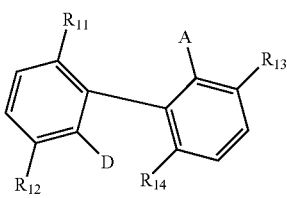

Formula (1-3)

$R_{11}$ and $R_{12}$ are each independently selected from the group consisting of alkyl, alkoxy, and the electron acceptor A'; and $R_{13}$ and $R_{14}$ are each independently selected from the group consisting of alkyl, alkoxy, and the nitrogen-containing electron donor D', wherein the nitrogen-containing electron donor D' is any one of a substituted or unsubstituted C12-C40 diphenylamino, a substituted or unsubstituted C12-C40 carbazolyl and derivative groups thereof, and a substituted or unsubstituted C13-C40 acridinyl and derivative groups thereof.

Among the above three embodiments, D is closest to A, and $R_{12}$ at the ortho-position of D and $R_{13}$ at the ortho-position of A are bulky groups rather than hydrogen atoms, which can generate a large steric hindrance.

According to an embodiment of the present disclosure, $R_{15}$-$R_{23}$ are each independently selected from the group consisting of C1-C6 alkyl, C1-C6 alkoxy, a substituted or unsubstituted C6-C20 aryl, and a substituted or unsubstituted C3-C20 heteroaryl.

According to one embodiment of the compound of the present disclosure, D is any one of the following groups:

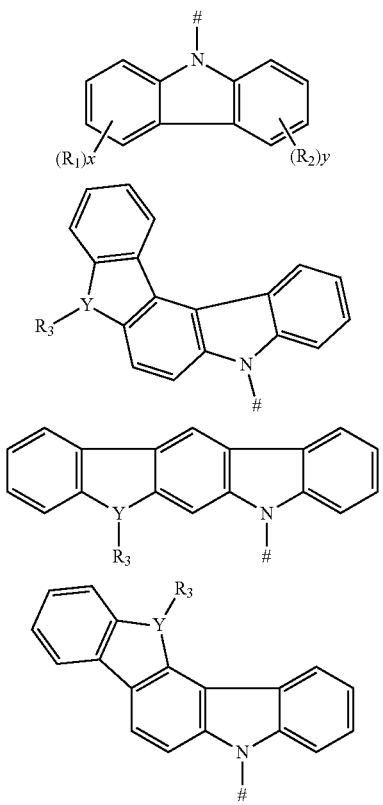

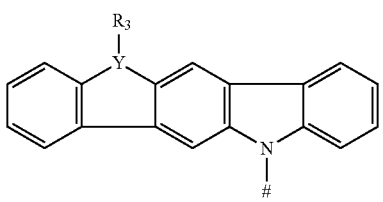

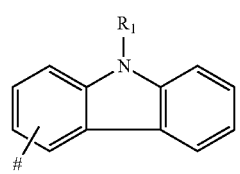

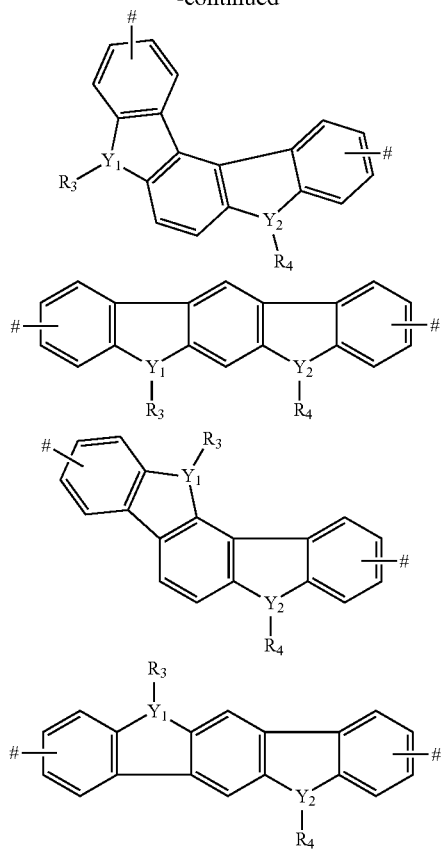

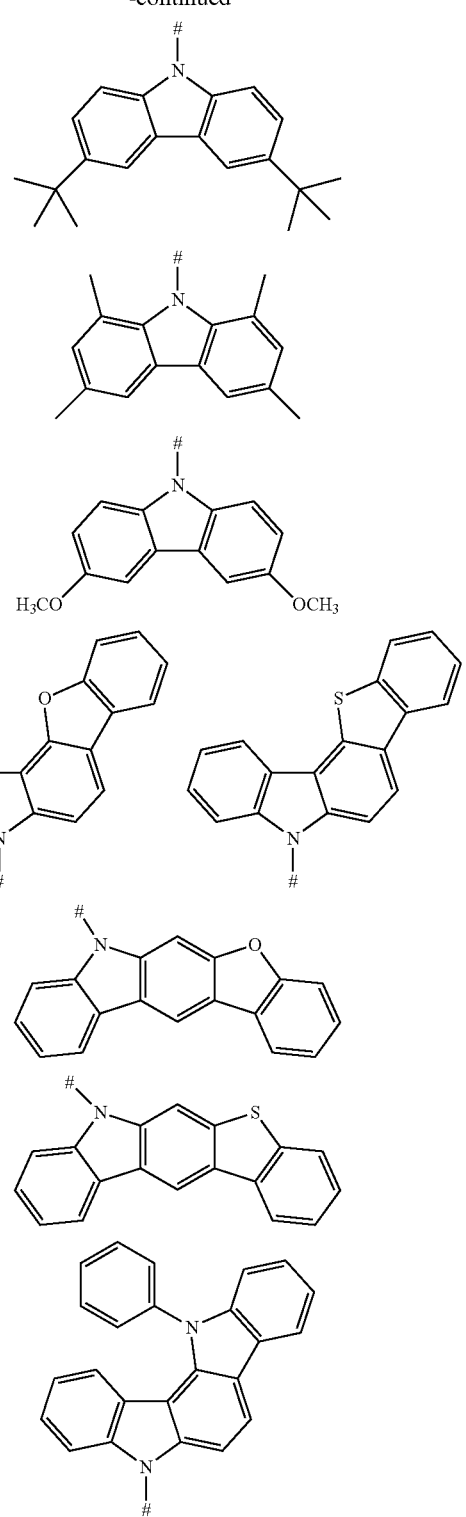

in which Y, $Y_1$ and $Y_2$ are each independently selected from the group consisting of a carbon atom, a nitrogen atom, an oxygen atom, a sulfur atom, and a silicon atom;

x and y are integers each independently selected from 0, 1, 2 or 3;

# indicates a bonding position to Formula (1), Formula (1-1), Formula (1-2), or Formula (1-3);

$R_1$, $R_2$, $R_3$, and $R_4$ are each independently selected from the group consisting of a hydrogen atom, C1-C20 alkyl, C1-C20 alkoxy, a substituted or unsubstituted C6-C40 aryl, a substituted or unsubstituted C4-C40 heteroaryl, a substituted or unsubstituted C12-C40 carbazolyl and derivative groups thereof, a substituted or unsubstituted C12-C40 diphenylamino and derivative groups thereof, a substituted or unsubstituted C13-C40 acridinyl and derivative groups thereof, when Y is an oxygen atom or a sulfur atom, $R_3$ is absent;

when $Y_1$ is an oxygen atom or a sulfur atom, $R_3$ is absent; and when $Y_2$ is an oxygen atom or a sulfur atom, $R_4$ is absent.

According to an embodiment of the present disclosure, D is any one of the following groups:

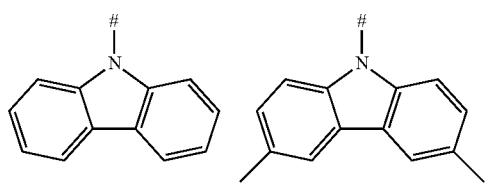

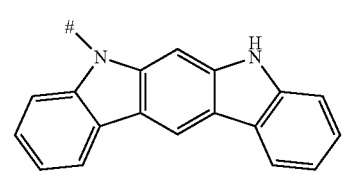

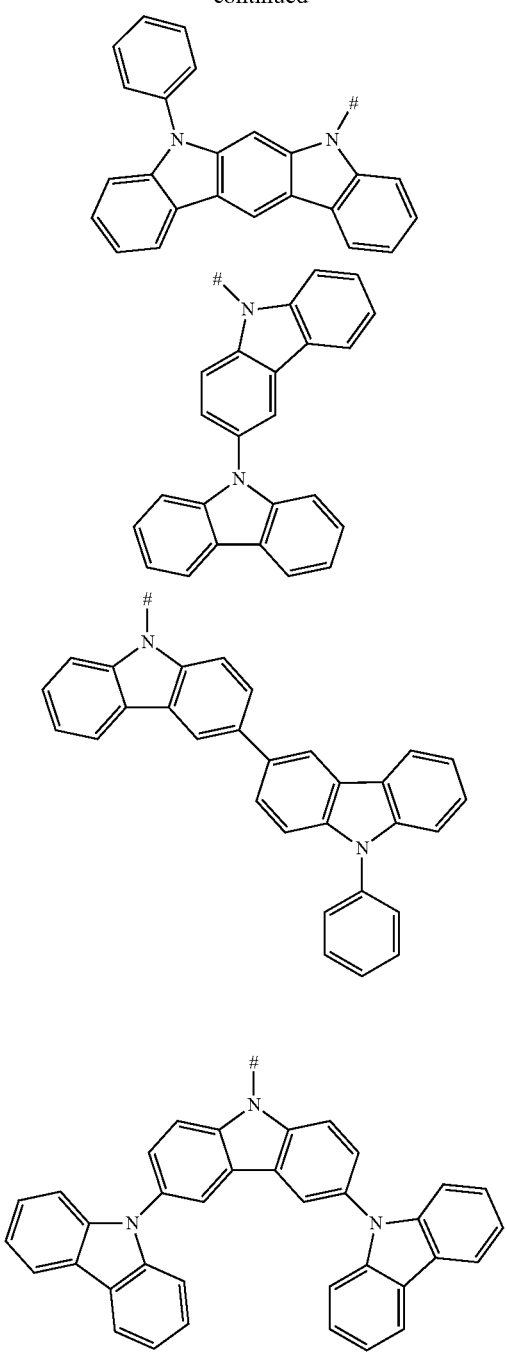
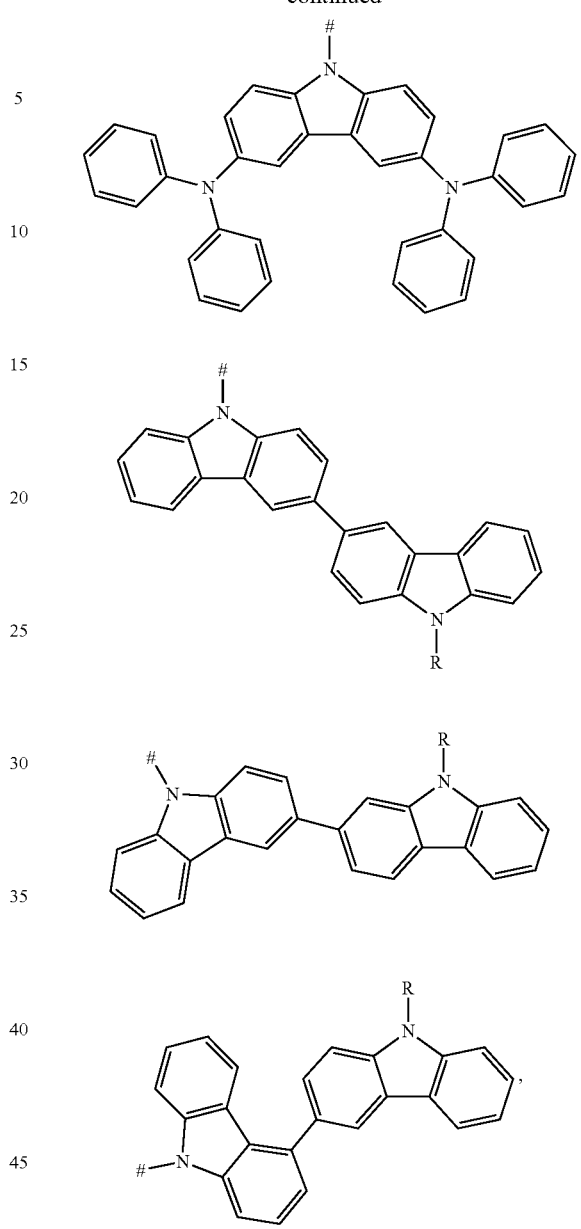
in which R is C1-C20 alkyl, C1-C20 alkoxy, C2-C20 alkenyl, C2-C20 alkynyl, C6-C40 aryl, C4-C40 heteroaryl; and
# indicates a bonding position to Formula (1).
According to an embodiment of the present disclosure, D is any one of the following groups:
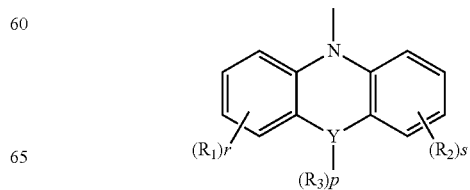

-continued

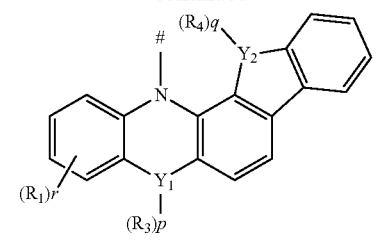

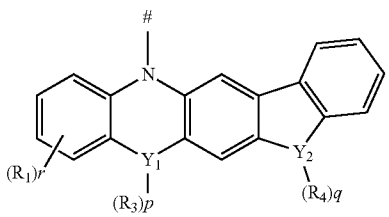

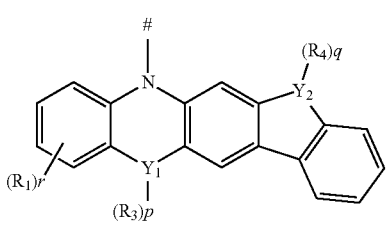

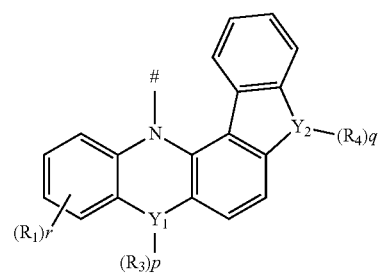

in which Y, $Y_1$ and $Y_2$ are each independently selected from the group consisting of a carbon atom, a nitrogen atom, an oxygen atom, a sulfur atom, and a silicon atom;

\# indicates a bonding position to Formula (1);

r and s are integers each independently selected from 0, 1, 2 or 3, p and q are integers each independently selected from 0, 1 or 2;

$R_1$, $R_2$, $R_3$, and $R_4$ are each independently selected from the group consisting of a hydrogen atom, C1-C20 alkyl, C1-C20 alkoxy, a substituted or unsubstituted C6-C40 aryl, a substituted or unsubstituted C4-C40 heteroaryl, a substituted or unsubstituted C12-C40 carbazolyl and derivative groups thereof, a substituted or unsubstituted C12-C40 diphenylamino and derivative groups thereof, a substituted or unsubstituted C13-C40 acridinyl and derivative groups thereof, when Y, $Y_1$ or $Y_2$ is an oxygen atom or a sulfur atom, p=0 or q=0;

when Y, $Y_1$ or $Y_2$ is a nitrogen atom, p and q are each independently 0 or 1; and when Y, $Y_1$ or $Y_2$ is a carbon atom or a silicon atom, p and q are integers each independently selected from 0, 1, or 2.

According to an embodiment of the present disclosure, D is any one of the following groups:

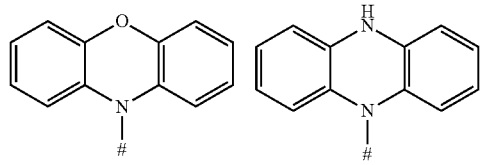

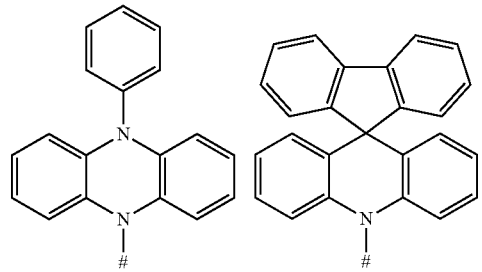

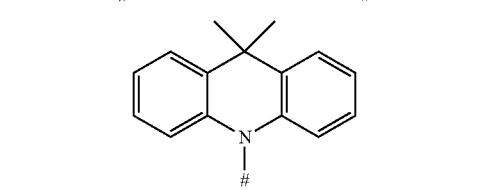

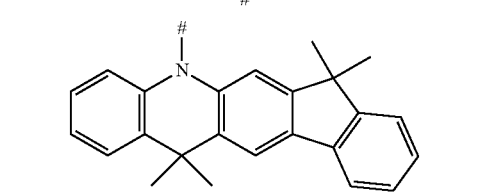

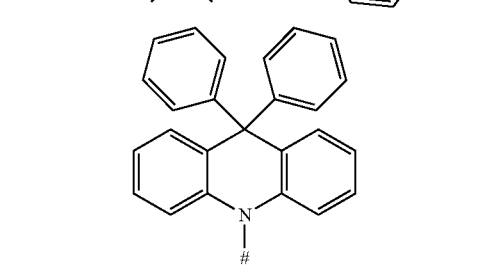

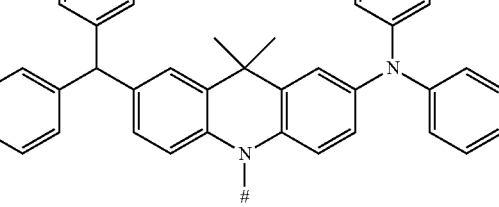

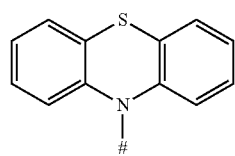

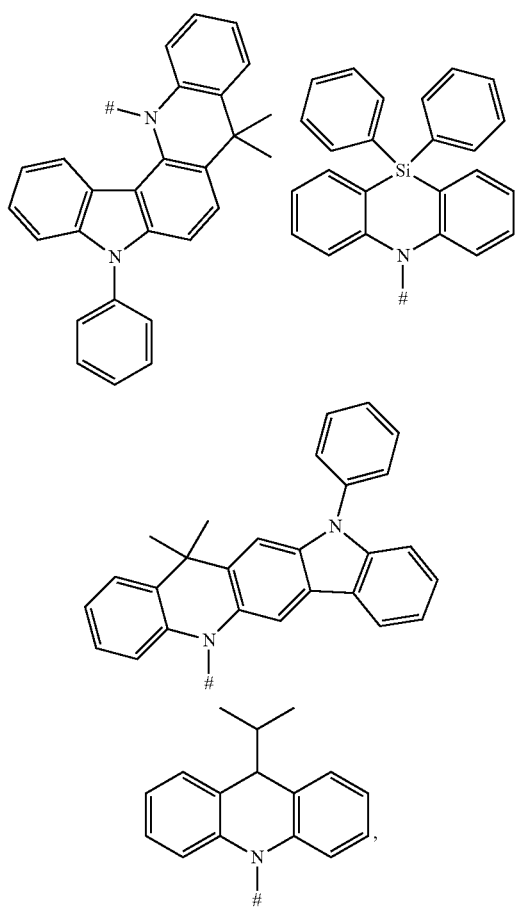

in which # indicates a bonding position to Formula (1), Formula (1-1), Formula (1-2), or Formula (1-3).

According to an embodiment of the present disclosure, D is any one of the following

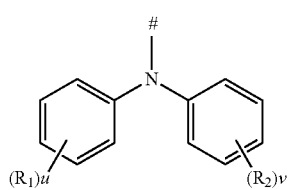

$R_1$, $R_2$ are each independently selected from the group consisting of a hydrogen atom, C1-C20 alkyl, C1-C20 alkoxy, a substituted or unsubstituted C6-C40 aryl, a substituted or unsubstituted C4-C40 heteroaryl, a substituted or unsubstituted C12-C40 carbazolyl and derivative groups thereof, a substituted or unsubstituted C12-C40 diphenylamino and derivative groups thereof, a substituted or unsubstituted C13-C40 acridinyl and derivative groups thereof;

u and v are integers each independently selected from 0, 1, 2 or 3; and # indicates a bonding position to Formula (1), Formula (1-1), Formula (1-2), or Formula (1-3).

According to an embodiment of the present disclosure, D is any one of the following groups:

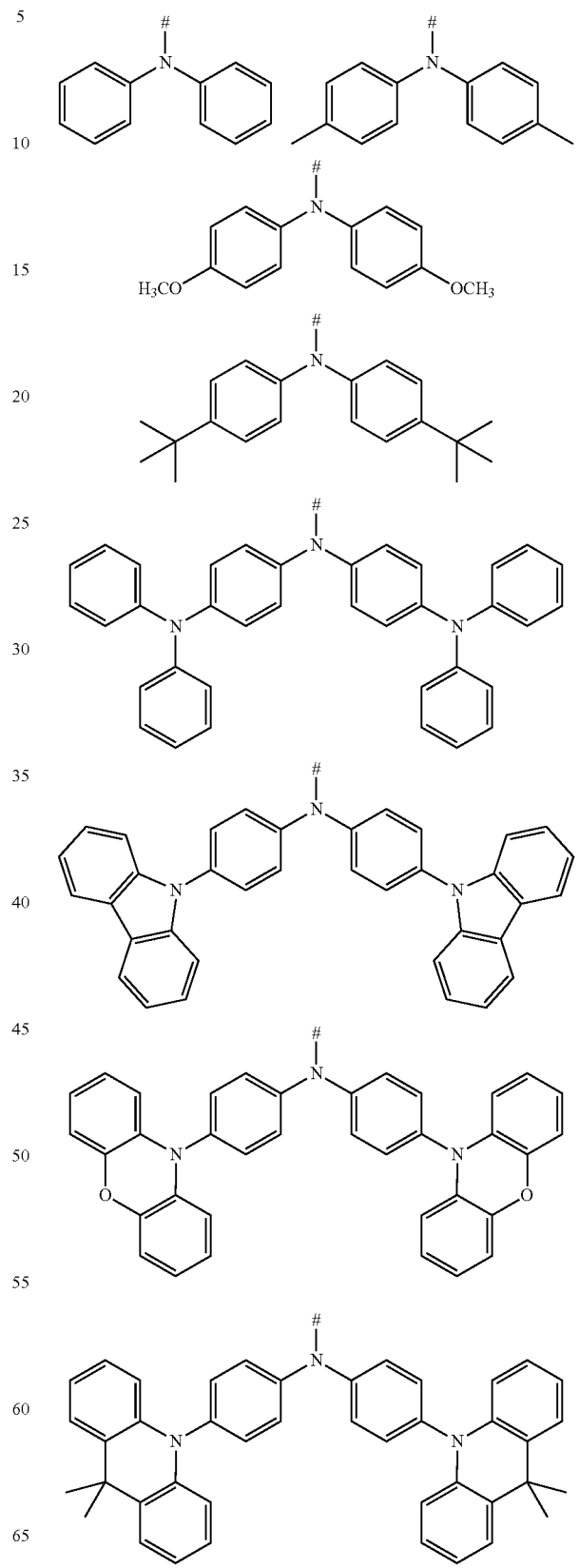

-continued
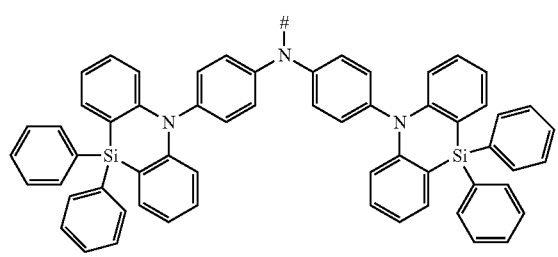
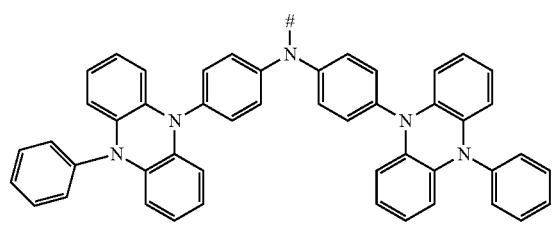
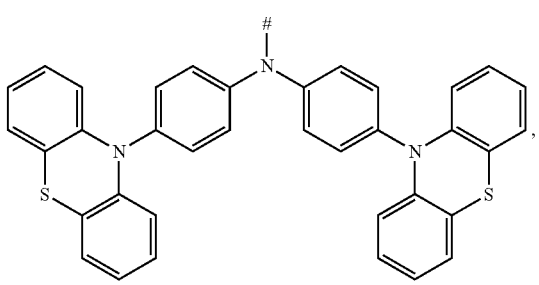
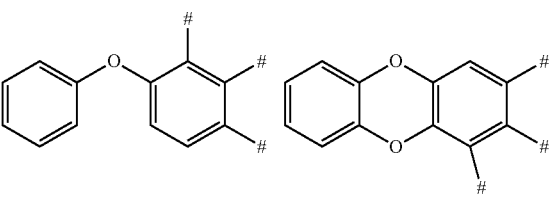
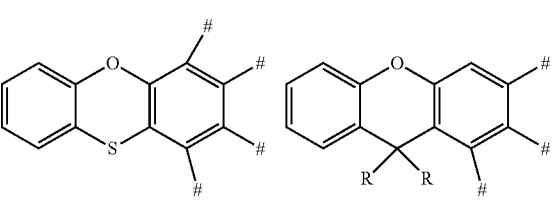
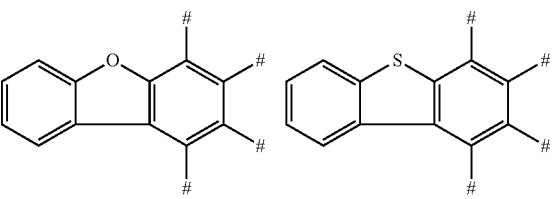
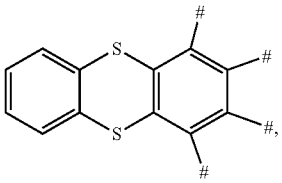
in which # indicates a bonding position to Formula (1).
According to an embodiment of the present disclosure, D is any one of the following groups:
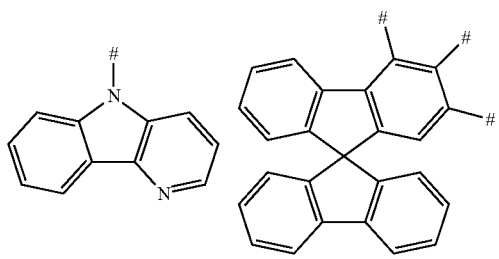
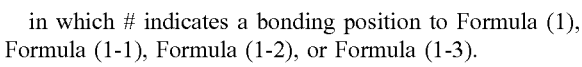
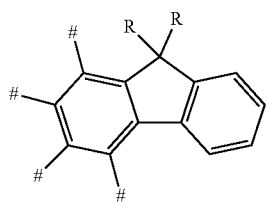
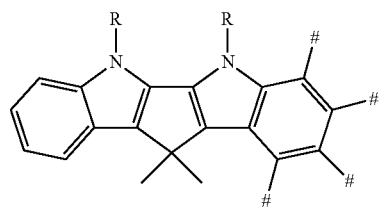
in which # indicates a bonding position to Formula (1), Formula (1-1), Formula (1-2), or Formula (1-3).
According to an embodiment of the present disclosure, the compound is any one of the following compounds:
H001
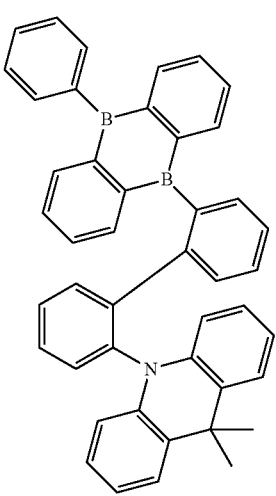

H002
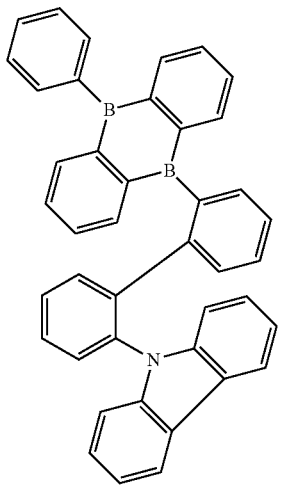
H003
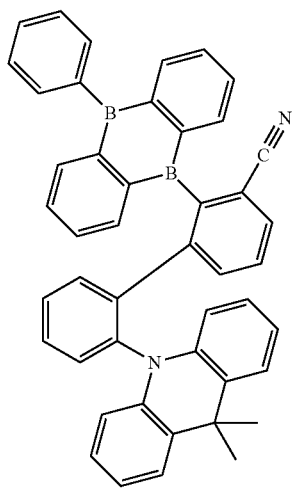
H004
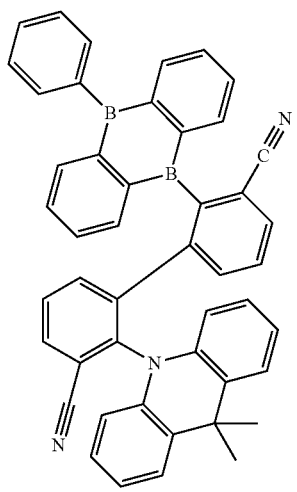
H005
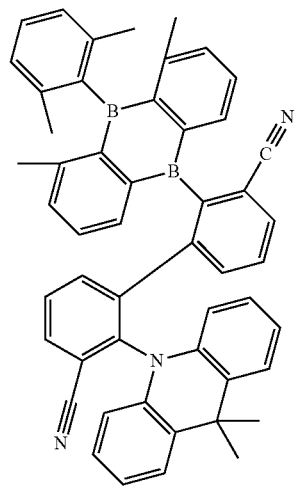
H006
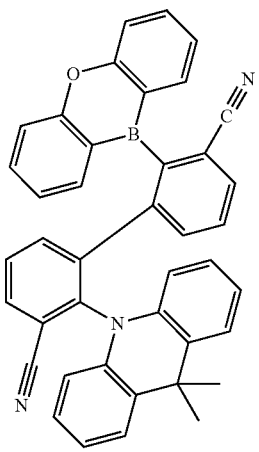
H007
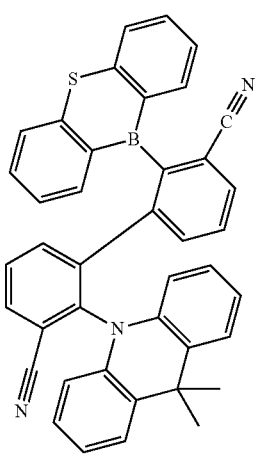

H008
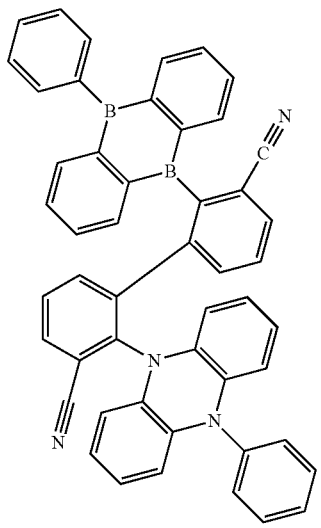
H009
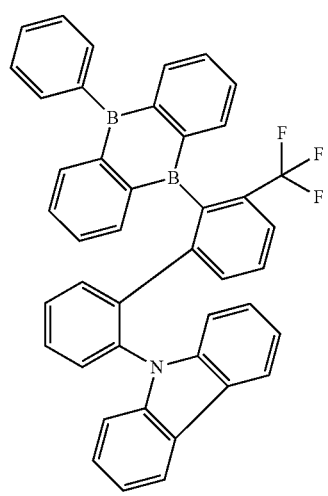
H010
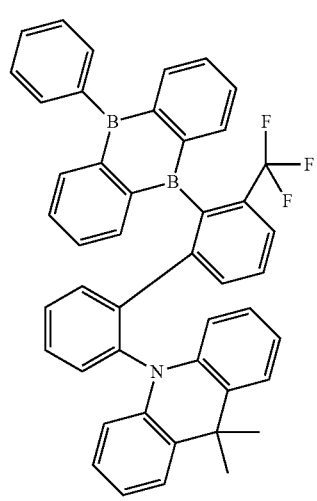
H011
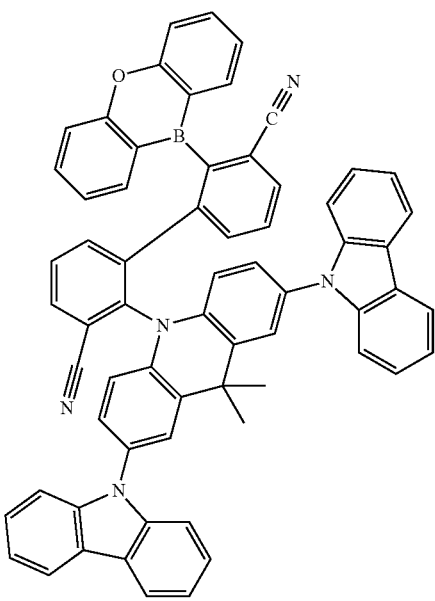
H012
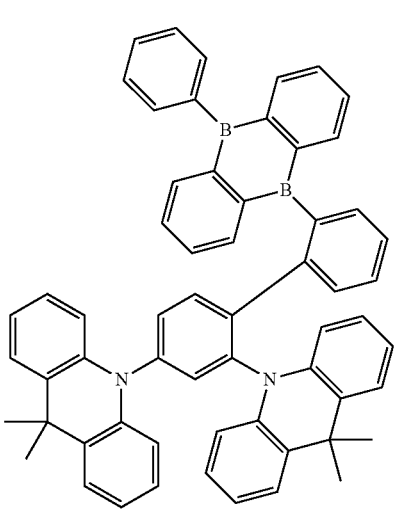
H013
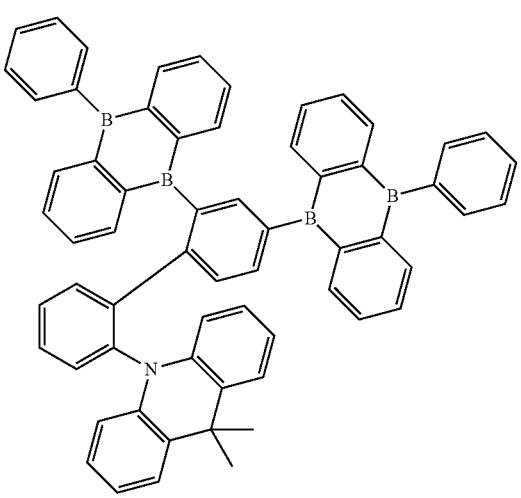

-continued
H014
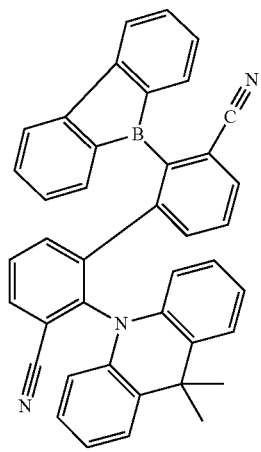
H015
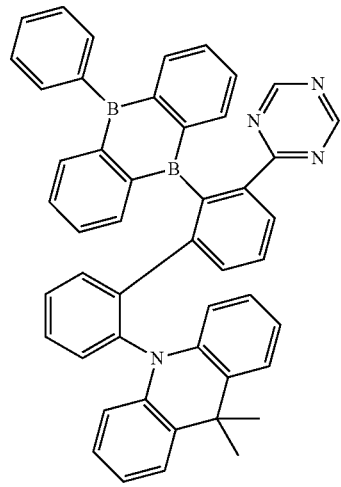
H016
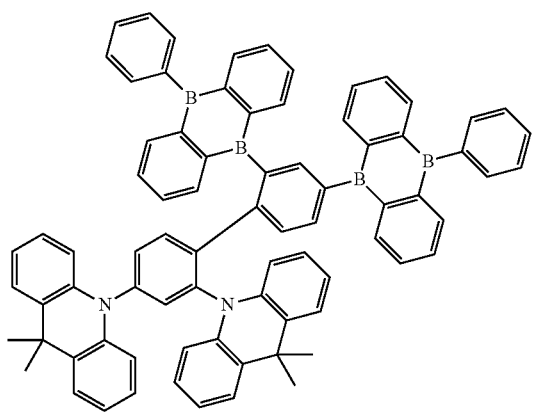
-continued
H017
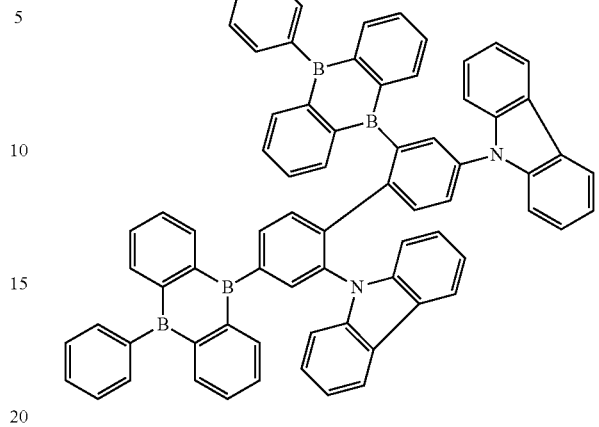
H018
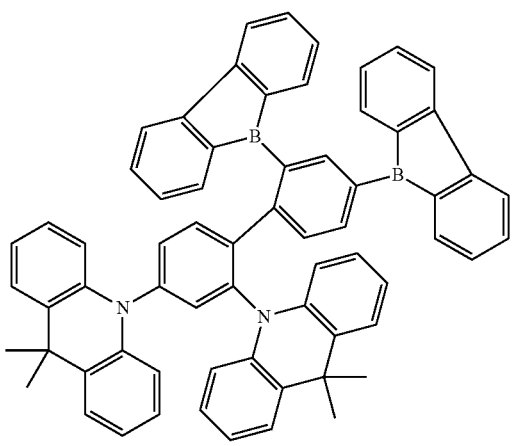
H019
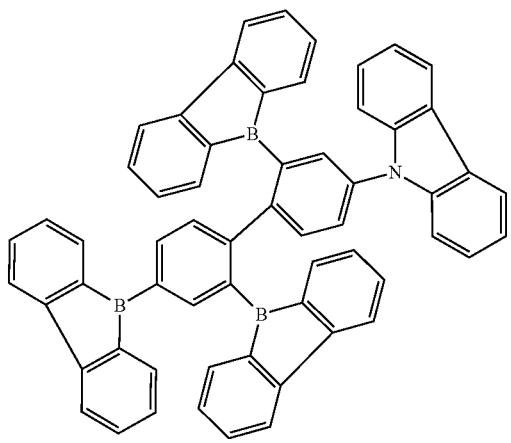

H020
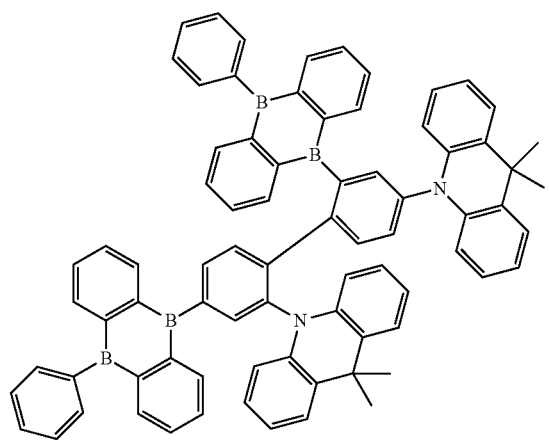
H021
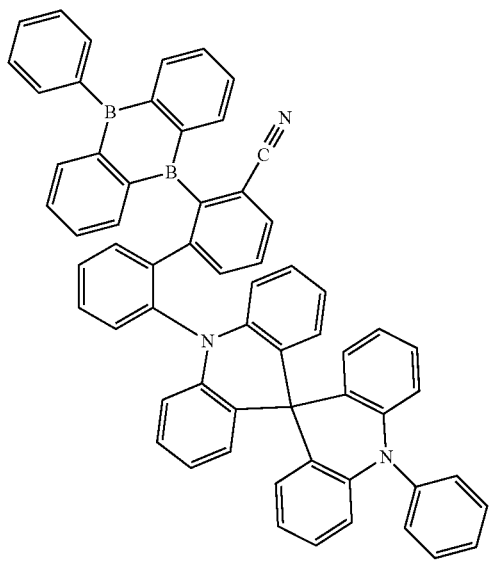
H022
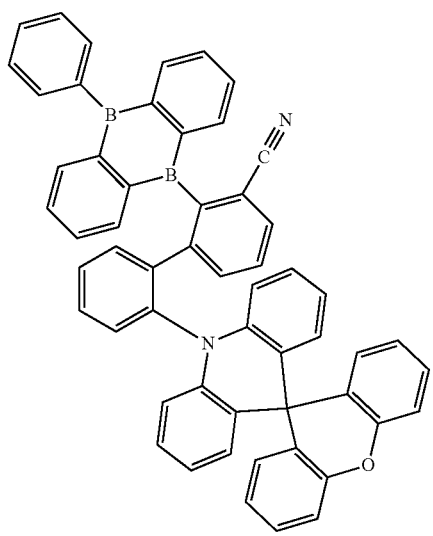
H023
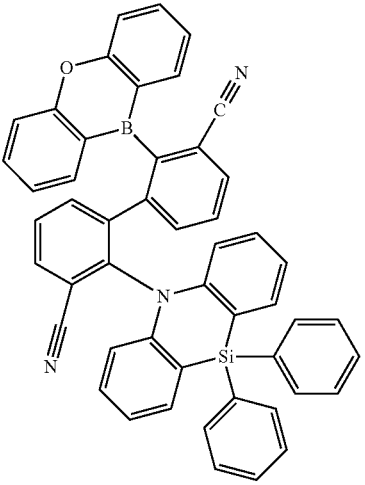
H024
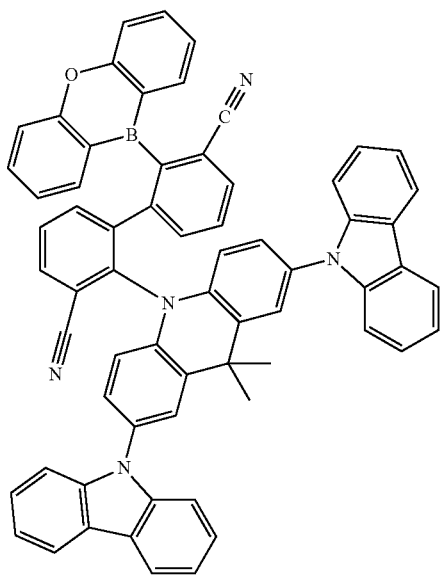
H025
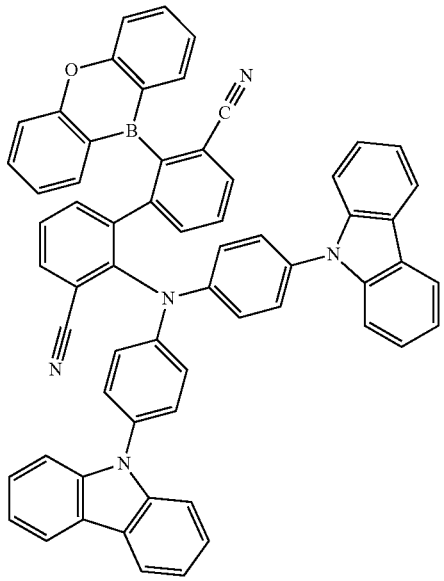

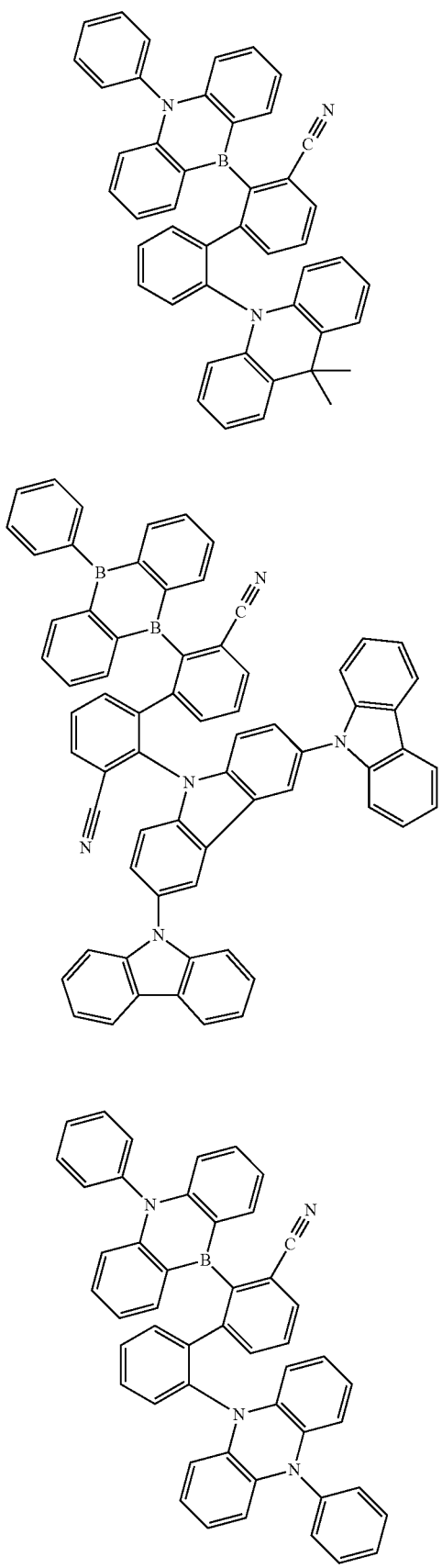
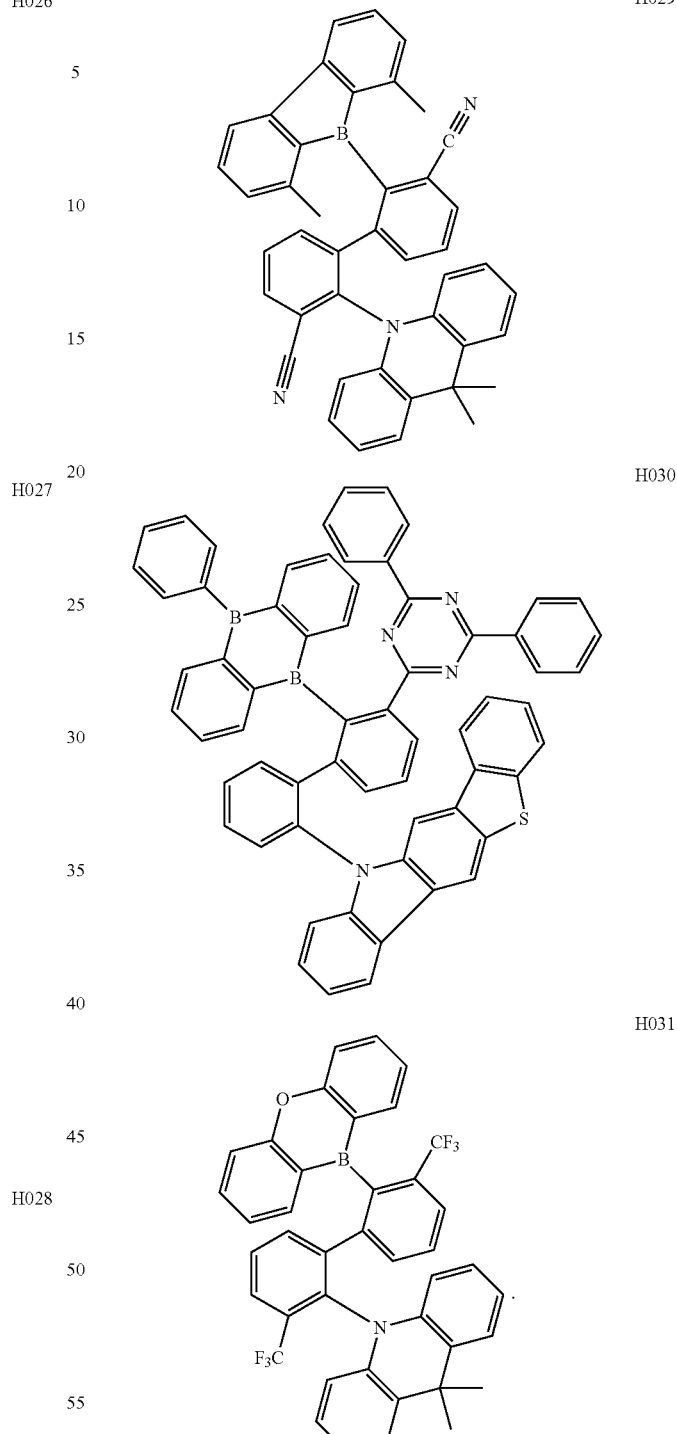

According to an embodiment of the present disclosure, an energy difference $\Delta E_{st}$ between a lowest singlet energy level S1 of the compound and a lowest triplet energy level T1 of the compound satisfies an equation $\Delta E_{st}=E_{S1}-E_{T1}\leq 0.30$ eV.

The present disclosure also provides several exemplary methods for preparing compounds, as described in the following Example 1, Example 2, Example 3, Example 4, and Example 5.

Compounds H001, H004, H005, H006, and H019 are synthesized according to the following synthetic scheme.

Example 1

Synthesis of Compound H001

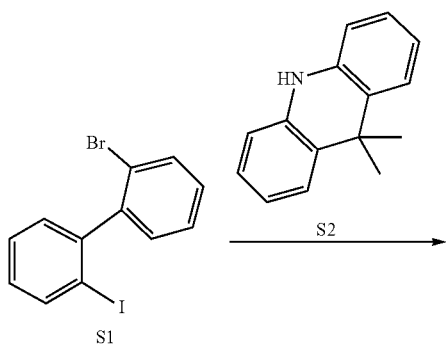

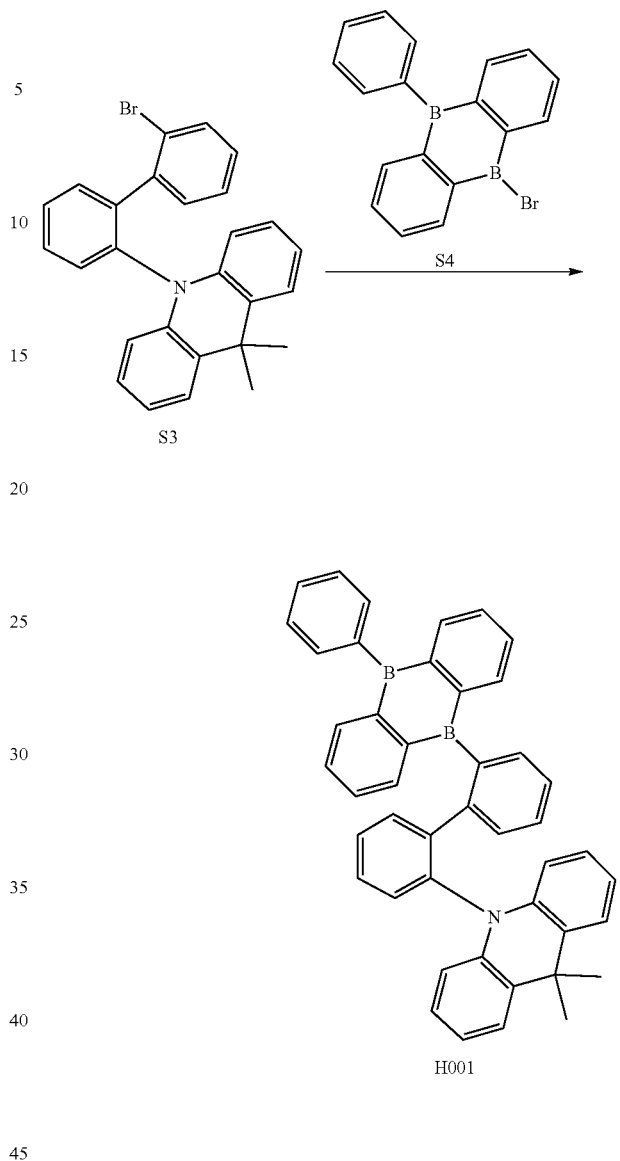

Compound S1 (10.0 mmol), 9,9-dimethyl-9,10-dihydroacridine S2 (10.5 mmol), (dibenzylideneacetone) dipalladium (0) (0.5 mmol), sodium t-butoxide (14 mmol) and tri-tert-butylphosphine tetrafluoroborate (1.0 mmol) were placed in a 500 mL flask with three necks, and degasification and nitrogen replacement were repeated three times during stirring, and then 200 mL of toluene was added through a syringe. The mixture was refluxed for 3 hours under nitrogen stream. After the reaction was completed, the mixture was cooled to room temperature, extracted with dichloromethane after adding water, and washed with saturated brine. After the organic phase was dried with anhydrous sodium sulfate, the solvent was removed by evaporation, and the crude product was purified by column chromatography to obtain an Intermediate S3 (6.5 mmol, 65%).

MALDI-TOF MS: m/z, calcd.: $C_{27}H_{22}BrN$: 439.1. found: 439.4.

Intermediate S3 (1.5 mmol) was dissolved in diethyl ether (40 mL) at a condition of −78° C., and n-hexane solution of n-BuLi (2.2 mmol) was added dropwise. The reaction solution was continuously stirred for 2 h, slowly warmed to room temperature, and then stirred at room temperature for 1 h. The reaction solution was cooled to −78° C. again, and added with 25 mL of a toluene solution of Compound S4 (1.6 mmol) dropwise while stirring. The reaction solution was slowly warmed to room temperature and stirred overnight. The solvents were removed by distillation under reduced pressure, and the crude product was collected. The crude product was washed with methanol (3×30 mL) and pentane (3×30 mL) and collected again. The crude product was purified by silica gel column chromatography, in which a mixture of n-hexane and trichloromethane (4:1) was used as eluent, so as to obtain a solid Compound H001 (1.17 mmol, 78%).

The characterized results were: MALDI-TOF MS: m/z, calcd.: $C_{45}H_{35}B_2N$: 611.3. found: 611.5; elemental analysis calcd.: C, 88.40; H, 5.77; B, 3.54; N, 2.29. found: C, 88.43; H, 5.80; B, 3.50; N, 2.27.

Example 2

Synthesis of Compound H004

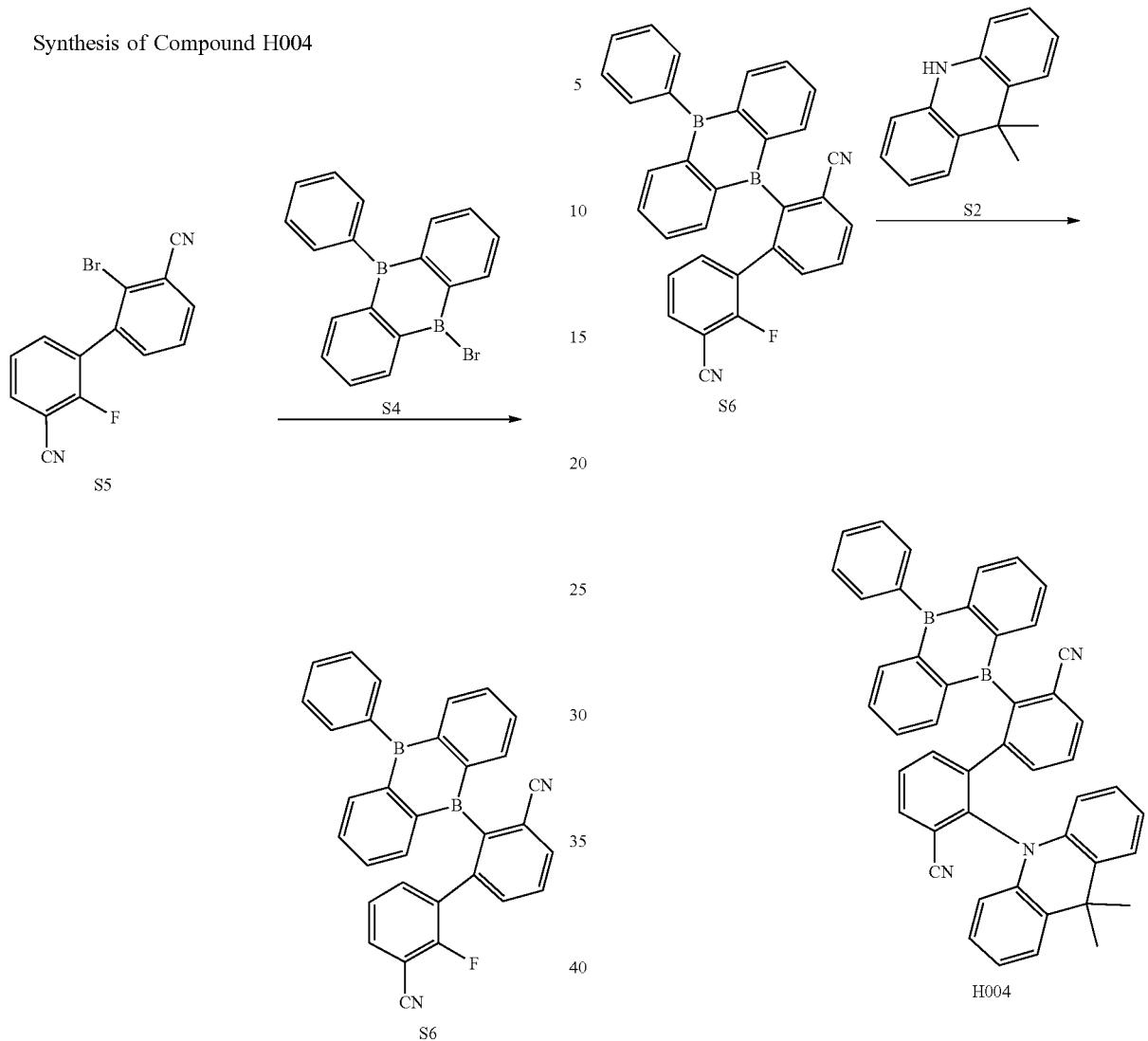

Compound S5 (2.5 mmol) was dissolved in diethyl ether (120 mL) at a condition of −78° C., and n-hexane solution of n-BuLi (3.5 mmol) was added dropwise. The reaction solution was continuously stirred for 2 h, slowly warmed to room temperature, and then stirred at room temperature for 1 h. The reaction solution was cooled to −78° C. again, and 45 mL of a toluene solution of Compound S4 (3.0 mmol) was added dropwise while stirring. The reaction solution was slowly warmed to room temperature and stirred overnight. The solvents were removed by distillation under reduced pressure, and the crude product was collected. The crude product was washed with methanol (3×60 mL) and pentane (3×60 mL) and then collected again. The crude product was purified by silica gel column chromatography, in which a mixture of n-hexane and trichloromethane (5:1) was used as eluent, so as to obtain a solid Compound S6 (1.73 mmol, 69%).

The characterized results were: MALDI-TOF MS: m/z, calcd.: $C_{32}H_{19}B_2FN_2$: 472.2. found: 472.3.

Under protection of nitrogen, Compound S6 (5.0 mmol) was weighed and added into a 250 mL flask with two necks, and 100 mL of anhydrous tetrahydrofuran was added to dissolve the Compound S6. NaH (stored in 60% oil, 6.0 mmol) was rinsed three times with n-hexane, and added to the flask with two necks, followed by stirring for 30 min. Then, Compound S2 (5.5 mmol) was added into the flask, reacted at room temperature while stirring overnight. The reaction was quenched with methanol and water. The organic phase was collected and dried over anhydrous $Na_2SO_4$ after performing an extraction with dichloromethane. The dried solution was filtered, and the solvent was removed using a rotary evaporator to obtain a crude product. The crude product was further purified through silica gel column chromatography to obtain a solid H002 (3.7 mmol, 74%).

MALDI-TOF MS: m/z, calcd.: $C_{32}H_{19}B_2FN_2$: 472.2. found: 472.4.

Elemental analysis calcd.: C, 81.41; H, 4.06; B, 4.58; F, 4.02; N, 5.93. found: C, 81.45; H, 4.08; B, 4.56; F, 4.00; N, 5.91.

Example 3

Synthesis of Compound H005

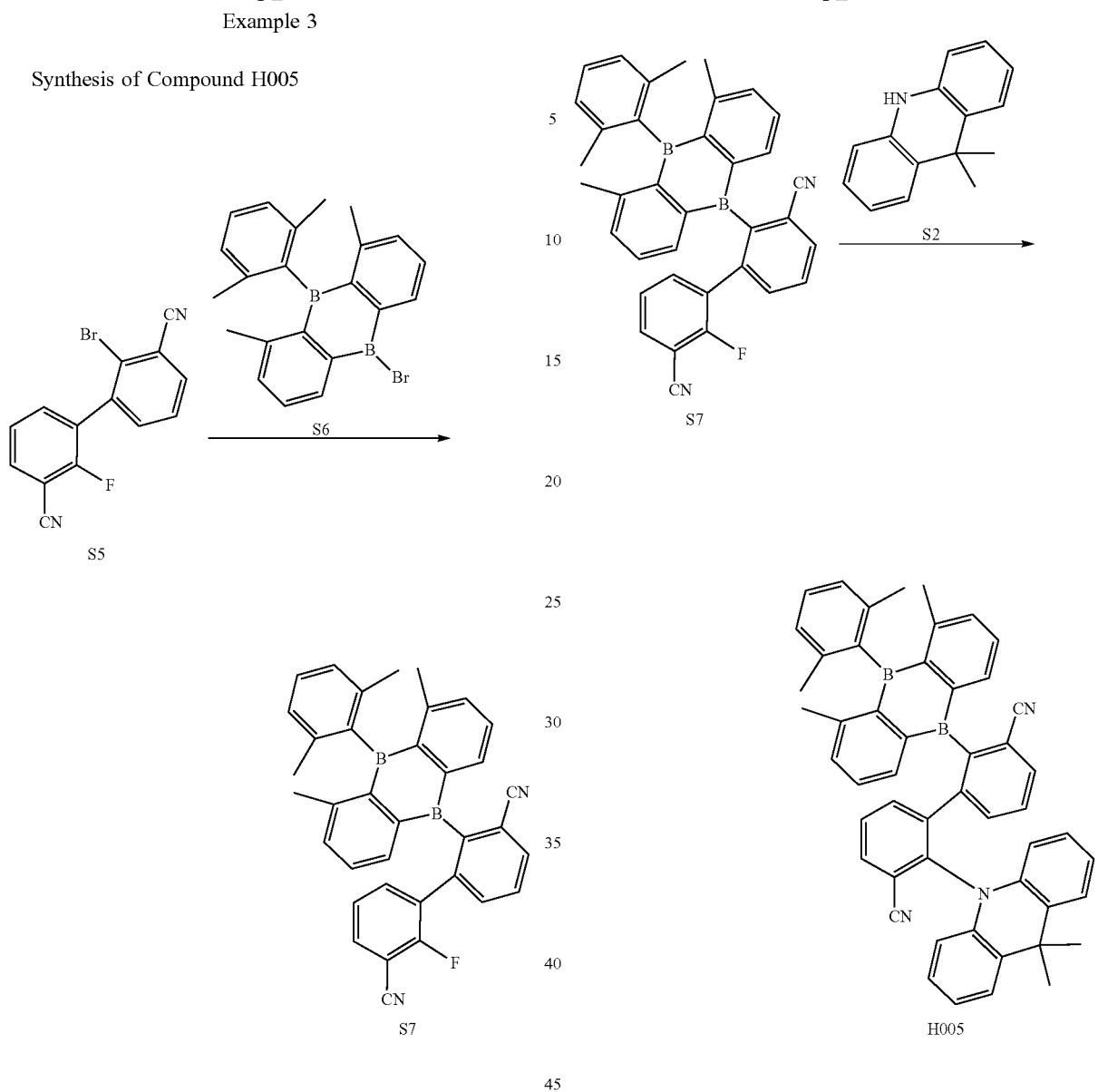

Compound S5 (2.5 mmol) was dissolved in diethyl ether (120 mL) at a condition of −78° C., and n-hexane solution of n-BuLi (2.5 mmol) was added dropwise. The reaction solution was continuously stirred for 2 h, slowly warmed to room temperature, and then stirred at room temperature for 1 h. The reaction solution was again cooled to −78° C., and 45 mL of a toluene solution of S6 (2.4 mmol) was added dropwise while stirring. The reaction solution was slowly warmed to room temperature and stirred overnight. The solvents were removed by distillation under reduced pressure, and the crude product was collected. The crude product was washed with methanol (3×50 mL) and pentane (3×50 mL) and the crude product was collected again. The crude product was purified by silica gel column chromatography, in which a mixture of n-hexane and trichloromethane (5:1) was used as eluent, so as to obtain a solid Compound S7 (3.25 mmol, 65%).

The characterized results were: MALDI-TOF MS: m/z, calcd.: $C_{32}H_{19}B_2FN_2$: 472.2. found: 472.3.

Under protection of nitrogen, Compound S7 (1.8 mmol) was weighed and added into a 100 mL flask with two necks, and 30 mL of anhydrous tetrahydrofuran was added to dissolve S6. NaH (stored in 60% oil, 2.2 mmol) was taken to be rinsed three times with n-hexane, added to the flask, and stirred for 30 min. Then, Compound S2 (2.1 mmol) was added to the flask with two necks, reacted at room temperature while stirring overnight. The reaction was quenched with methanol and water. The organic phase was collected and dried over anhydrous $Na_2SO_4$ after performing an extraction with dichloromethane. The dried solution was filtered, and the solvent was removed using a rotary evaporator to obtain a crude product. The crude product was further purified through silica gel column chromatography to obtain a solid Compound H005 (1.1 mmol, 62%).

MALDI-TOF MS: m/z, calcd.: $C_{51}H_{41}B_2N_3$: 717.4. found: 717.6.

Elemental analysis calcd.: C, 85.37; H, 5.76; B, 3.01; N, 5.86. found: C, 85.40; H, 5.78; B, 2.98; N, 5.84.

Example 4

Synthesis of Compound H006

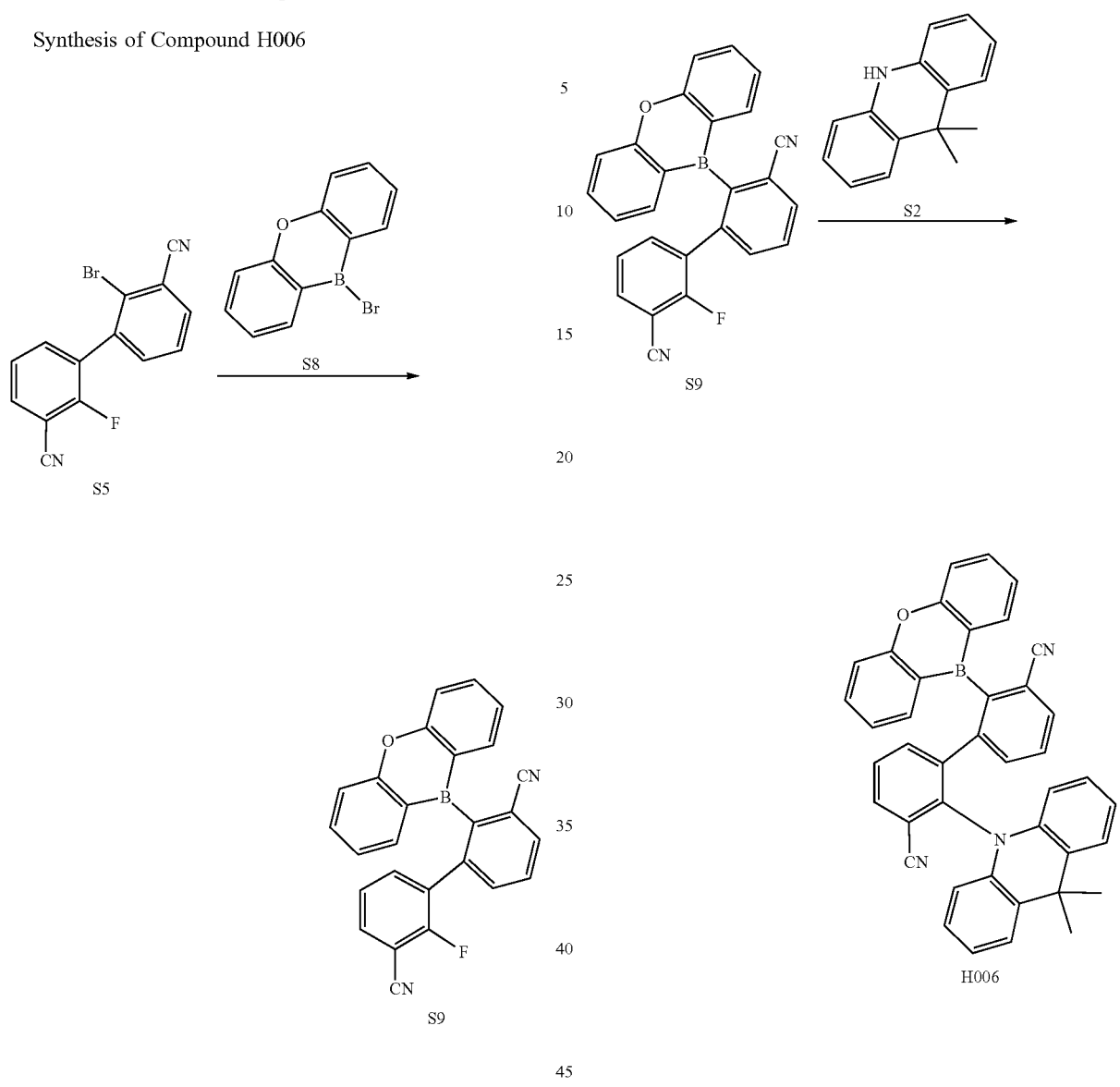

Compound S5 (3.0 mmol) was dissolved in diethyl ether (100 mL) at a condition of −78° C., and n-hexane solution of n-BuLi (3.5 mmol) was added dropwise. The reaction solution was continuously stirred for 2 h, slowly warmed to room temperature, and then stirred at room temperature for 1 h. The reaction solution was cooled to −78° C. again, and 35 mL of a toluene solution of Compound S8 (3.6 mmol) was added dropwise while stirring. The reaction solution was slowly warmed to room temperature and stirred overnight. All solvents were removed by distillation under reduced pressure, and the crude product was collected. The crude product was washed with methanol (3×50 mL) and pentane (3×50 mL) and the crude product was collected again. The crude product was purified by silica gel column chromatography, in which a mixture of n-hexane and trichloromethane (10:3) was used as eluent, so as to obtain a solid Compound S9 (2.2 mmol, 73%).

The characterized results were: MALDI-TOF MS: m/z, calcd.: $C_{26}H_{14}BFN_2O$: 400.1. found: 400.3.

Under protection of nitrogen, Compound S9 (2.4 mmol) was weighed and added into a 250 mL flask with two necks, and 50 mL of anhydrous tetrahydrofuran was added to dissolve Compound S6. NaH (stored in 60% oil, 2.9 mmol) was taken to be rinsed three times with n-hexane, added to the flask, and stirred for 30 min. Then, Compound S2 (2.8 mmol) was added to the flask with two necks, reacted at room temperature while stirring overnight. The reaction was quenched with methanol and water. The organic phase was collected and dried over anhydrous $Na_2SO_4$ after performing an extraction with dichloromethane. The dried solution was filtered, and the solvent was removed using a rotary evaporator to obtain a crude product. The crude product was further purified through silica gel column chromatography to obtain a solid Compound H006 (1.66 mmol, 69%).

MALDI-TOF MS: m/z, calcd.: $C_{41}H_{28}B_2N_3O$: 589.2. found: 589.5.

Elemental analysis calcd.: C, 83.54; H, 4.79; B, 1.83; N, 7.13; O, 2.71. found: C, 83.57; H, 4.81; B, 1.81; N, 7.11; O, 2.70.

Example 5

Synthesis of Compound H019

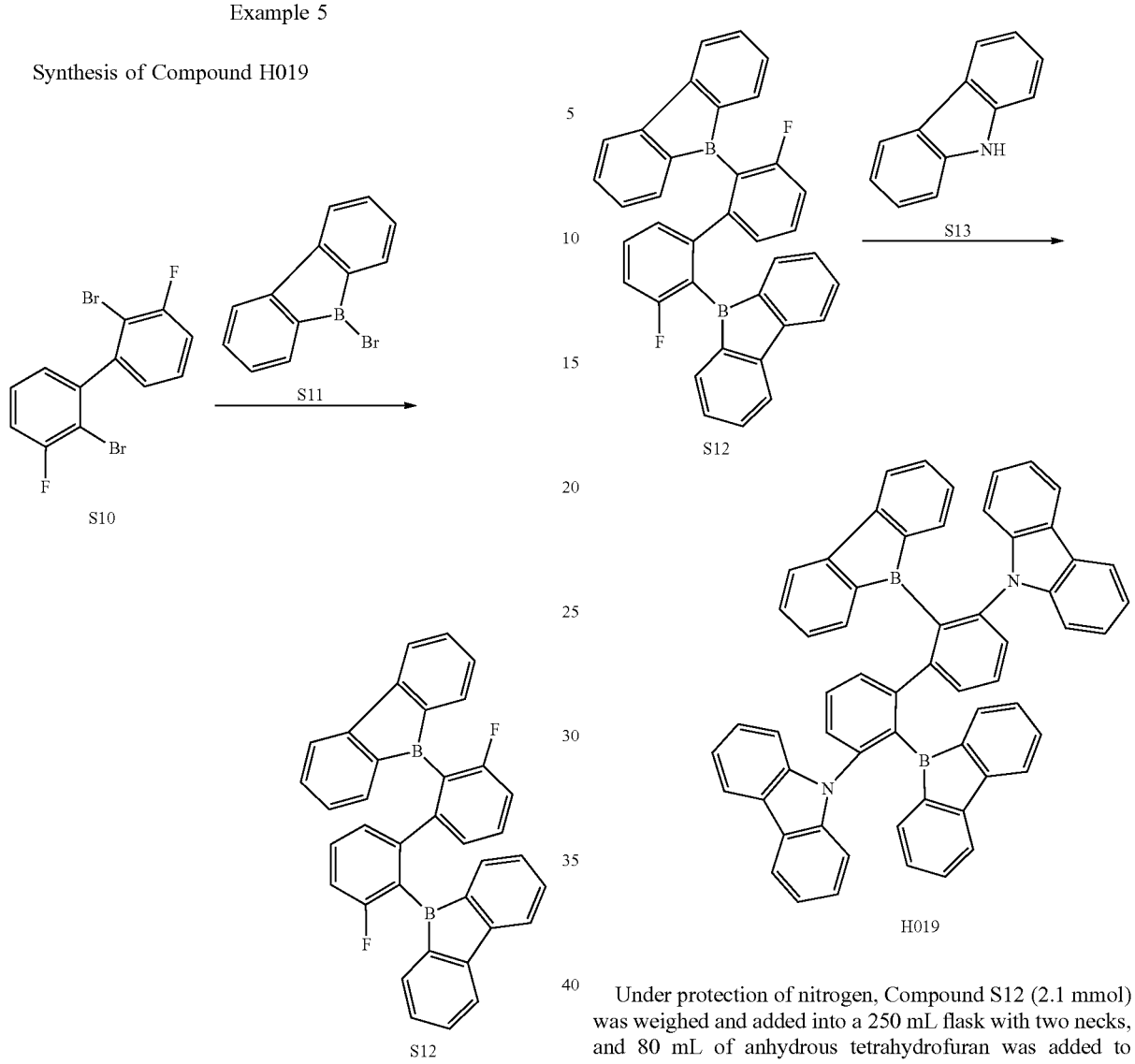

Compound S10 (1.6 mmol) was dissolved in diethyl ether (100 mL) at a condition of −78° C., and n-hexane solution of n-BuLi (3.7 mmol) was added dropwise. The reaction solution was continuously stirred for 2 h, slowly warmed to room temperature, and then stirred at room temperature for 1 h. The reaction solution was cooled to −78° C. again, and 40 mL of a toluene solution of Compound S8 (3.6 mmol) was added dropwise while stirring. The reaction solution was slowly warmed to room temperature while stirring overnight. The solvents were removed by distillation under reduced pressure, and the crude product was collected. The crude product was washed with methanol (3×50 mL) and pentane (3×50 mL) and the crude product was collected again. The crude product was purified by silica gel column chromatography, in which a mixture of n-hexane and trichloromethane (4:1) was used as eluent, so as to obtain a solid Compound S9 (1.1 mmol, 63%).

The characterized results were: MALDI-TOF MS: m/z, calcd.: $C_{36}H_{22}B_2F_2$: 514.2. found: 514.3.

Under protection of nitrogen, Compound S12 (2.1 mmol) was weighed and added into a 250 mL flask with two necks, and 80 mL of anhydrous tetrahydrofuran was added to dissolve Compound S6. NaH (stored in 60% oil, 4.6 mmol) was taken to be rinsed three times with n-hexane, added to the flask, and stirred for 30 min. Then, Compound S13 (4.5 mmol) was added to the flask with two necks, reacted at room temperature, and stirred overnight. The reaction was quenched with methanol and water. The organic phase was collected and dried over anhydrous $Na_2SO_4$ after performing an extraction with dichloromethane. The dried solution was filtered, and the solvent was removed using a rotary evaporator to obtain a crude product. The crude product was further purified through silica gel column chromatography to obtain a solid Compound H019 (1.22 mmol, 58%).

MALDI-TOF MS: m/z, calcd.: $C_{60}H_{38}B_2N_2$: 808.3. found: 808.5.

Elemental analysis calcd.: C, 89.12; H, 4.74; B, 2.67; N, 3.46. found: C, 89.15; H, 4.76; B, 2.65; N, 3.43.

Example 6

The HOMO, LUMO and other parameters of boron heterocyclic pyrene compounds H001, H003, H004, H005, H006, H007, H019 and H031 were tested, and the results are shown in Table 1.

TABLE 1

Parameters of the compounds

| Compounds | HOMO (eV) | LUMO (eV) | S1 (eV) | T1 (eV) | $\Delta E_{ST}$ (eV) | Eg (eV) |
|---|---|---|---|---|---|---|
| H001 | −5.30 | −2.74 | 2.80 | 2.69 | 0.11 | 2.56 |
| H003 | −5.48 | −2.86 | 2.86 | 2.68 | 0.18 | 2.92 |
| H004 | −5.58 | −3.03 | 2.69 | 2.60 | 0.09 | 2.55 |
| H005 | −5.56 | −2.98 | 2.72 | 2.61 | 0.11 | 2.58 |
| H006 | −5.57 | −2.34 | 3.14 | 3.08 | 0.06 | 3.23 |
| H007 | −5.58 | −2.43 | 3.11 | 2.85 | 0.26 | 3.15 |
| H019 | −5.52 | −1.86 | 3.09 | 2.96 | 0.13 | 3.66 |
| H031 | −5.32 | −2.09 | 3.32 | 3.23 | 0.09 | 3.23 |

Notes:
$S_1$ represents singlet energy level, $T_1$ represents triplet energy level, $\Delta E_{ST}$ represents energy difference between the singlet energy level and the triplet energy level, and Eg is an energy difference of HOMO-LUMO.

It can be seen from Table 1 that all the compounds have the $\Delta E_{ST}$ smaller than 0.3 ev, i.e., a small energy difference between the singlet energy level and the triplet energy level, which means the compounds are suitable to be used as thermally activated delayed fluorescent materials.

The present disclosure also provides a display panel including an organic light-emitting device. The organic light-emitting device includes an anode, a cathode arranged opposite to the anode, and a light-emitting layer disposed between the anode and the cathode. A light-emitting material of the light-emitting layer includes one or more of the compounds according to the present disclosure.

According to an embodiment of the display panel of the present disclosure, the light-emitting material of the light-emitting layer includes a host material and a guest material, and the host material is one or more of the compounds according to the present disclosure.

According to an embodiment of the display panel of the present disclosure, the light-emitting layer includes a red light-emitting layer, and the host material is a red light-emitting host material.

According to an embodiment of the display panel of the present disclosure, the light-emitting layer includes a green light-emitting layer, and the host material is a green host material.

According to an embodiment of the display panel of the present disclosure, the organic light-emitting device further includes one or more layers selected from a hole injection layer, a hole transmission layer, an electron blocking layer, a hole blocking layer, an electron transmission layer or an electron injection layer.

An organic functional layer according to the present disclosure further includes one or more layers selected from a hole injection layer (HIL), a hole transmission layer (HTL), an electron blocking layer (EBL), a hole blocking layer (HBL), an electron transmission layer (ETL), and an electron injection layer (EIL).

The hole injection layer, the hole transmission layer, and the electron blocking layer are each made of a material selected from a group consisting of 2,2'-dimethyl-N,N'-bis(1-naphthyl)-N,N'-diphenyl[1,1'biphenyl]-4,4"diamine (α-NPD), 4,4',4"-tris(carbazol-9-yl)-triphenylamine (TCTA), 1,3-bis(N-carbazolyl)benzene (mCP), 4,4'-bis(9-carbazole)biphenyl (CBP), 3,3'-bis(N-carbazolyl)-1,1'-biphenyl (mCBP), 2,3,6,7,10,11-hexacyano-1,4,5,8,9,12-hexaazatriphenylene (HATCN), 4,4'-cyclohexylidenebis[N,N-bis(4-methylphenyl)aniline](TAPC), N,N'-diphenyl-N,N'-(1-naphthyl)-1,1'-biphenyl-4,4'-diamine (α-NPB), N,N'-bis (naphthalen-2-yl)-N,N'-di(phenyl)biphenyl-4,4'-diamine (NPB), poly(3,4-ethylenedioxythiophene)-polystyrene-sulfonate (PEDOT: the PSS), polyvinyl carbazole (PVK), 9-phenyl-3,9-bicarbazolyl (CCP), and molybdenum trioxide (MoO3). However, the material is not limited thereto.

The hole blocking layer, the electron transmission layer, or the electron injection layer each can be made of a material selected from a group consisting of 2,8-bis(diphenylphosphinyl)dibenzothiophene (PPT), TSPO1, 2,2',2"-(1,3,5-Benzinetriyl)-tris(1-phenyl-1-H-benzimidazole) (TPBi), 2,8-bis(diphenylphosphinyl)dibenzofuran (PPF), bis[2-(diphenylphosphino)phenyl] ether oxide (DPEPO), lithium fluoride (LiF), 4,6-bis(3,5-di-3-pyridylphenyl)-2-methylpyrimidine (B3PYMPM), 4,7-diphenyl-1,10-phenanthroline (Bphen), 1,3,5-tris[(3-pyridyl)-3-phenyl]benzene (TmPyBP), tris[2,4,6-trimethyl-3-(3-pyridyl)phenyl]borane (3TPYMB), 1,3-bis(3,5-dipyridine-3-yl-phenyl)benzene (B3PYPB), 1,3-bis[3,5-di(pyridin-3-yl)phenyl]benzene (BMPYPHB), 2,4,6-Tris(biphenyl-3-yl)-1,3,5-triazine (T2T), diphenylbis(4-(pyridin-3-yl)phenyl)silane (DPPS), cesium carbonate ($Cs_2O_3$), bis(2-methyl-8-quinolinolato-N1,O8)-(1,1'-Biphenyl-4-olato)aluminum (BAlq), 8-hydroxyquinoline lithium (Liq), and tris(8-hydroxyquinoline) aluminum ($Alq_3$). However, the material is not limited thereto.

In embodiments of the display panel provided by the present disclosure, the anode material of the organic light-emitting device may be selected from metals such as copper, gold, silver, iron, chromium, nickel, manganese, palladium, platinum, and the like, and alloys thereof. The anode material may also be selected from metal oxides such as indium oxide, zinc oxide, indium tin oxide (ITO), indium zinc oxide (IZO), and the like. The anode material may also be selected from conductive polymers such as polyaniline, polypyrrole, poly(3-methylthiophene) and the like. In addition to the anode material mentioned above, the anode also can be made of any suitable material selected from the anode materials known in the related art, and combinations thereof, as long as the material of the anode is conductive to injecting holes.

In embodiments of the display panel provided by the present disclosure, the cathode material of the organic light-emitting device may be selected from metals such as aluminum, magnesium, silver, indium, tin, titanium, and the like, and alloys thereof. The cathode also can be made of multiple-layer metal material, such as LiF/Al, $LiO_2$/Al, $BaF_2$/Al, and the like. In addition to the cathode materials listed above, the cathode also can be made of any suitable material selected from the cathode material known in the related art, and combinations thereof, as long as the material of the cathode is conductive to injecting holes.

In an embodiment, the organic light-emitting display device of the present disclosure can be manufactured by forming an anode on a transparent or opaque smooth substrate, forming an organic thin layer on the anode, and further forming a cathode on the organic thin layer. The organic thin layer can be formed by vapor deposition, sputtering, spin coating, dipping, ion plating, and the like.

Figure 2:
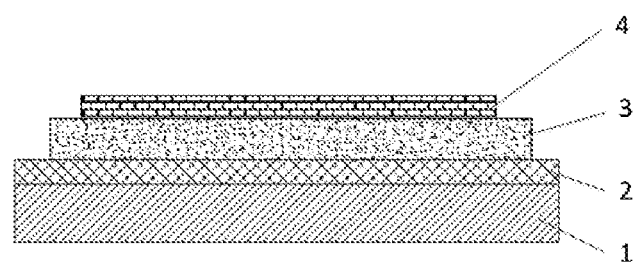
FIG. 2 is a structural schematic diagram of an OLED according to an embodiment of the present disclosure.

In an embodiment of the display panel of the present disclosure, the organic light-emitting device (OLED) has a structure as shown in FIG. 2. Referring to FIG. 2, a substrate made of glass or other suitable materials (such as plastic) is denoted with reference sign 1; a transparent anode such as ITO or IGZO is denoted with reference sign 2; reference sign 3 represents a light-emitting layer; reference sign 4 denotes a metal cathode, all of which constitute a complete OLED device.

Example 6

Example 6 illustrates an embodiment of the practical application of the compound according to the present disclosure in an organic light-emitting display panel, in which the compound according to the present disclosure is used as a dopant material in the light-emitting layer.

A substrate having an Indium Tin Oxide (ITO) film with a thickness of 100 nm was ultrasonically washed with distilled water, acetone, and isoinol, then dried in an oven, and the surface was subjected to UV treatment for 30 minutes. Then the substrate was transferred to a vacuum vapor deposition chamber. The vapor deposition of each layer was carried out under a vacuum of $2 \times 10^{-6}$ Pa. A hole injection layer was formed by depositing 5 nm of HATCN. A hole transmission layer (HTL) was formed by depositing 40 nm of N,N'-diphenyl-N,N'-bis(1-naphthyl)-1,1'biphenyl-4,4"diamine (α-NPB) and then depositing 10 nm of 4,4',4"-tris(carbazol-9-yl)-triphenylamine (TCTA). The compound H001 according to the present disclosure used as a dopant of the light-emitting layer, and 3,3'-bis (N-carbazolyl)-1,1'-biphenyl (mCBP) used as a host material of the light-emitting layer, are deposited on the hole transmission layer at the same time, so as to form a light-emitting layer having a thickness of 30 nm. A hole blocking layer (HBL) having a thickness of 5 nm was deposited on the light-emitting layer with diphenyl [4-(triphenylsilyl) phenyl] phosphine oxide (TSPO1). An electron transmission layer (ETL) having a thickness of 30 nm was deposited on the hole blocking layer with 4,7-diphenyl-1,10-phenanthroline (Bphen). Then, a LiF layer having a thickness of 2.5 nm and an Al layer having a thickness of 100 nm were deposited on the electron transmission layer sequentially, serving as an electron injection layer (EIL) and a cathode respectively, so as to obtain an organic light-emitting display device.

The organic light-emitting device also can be manufactured by a solution method.

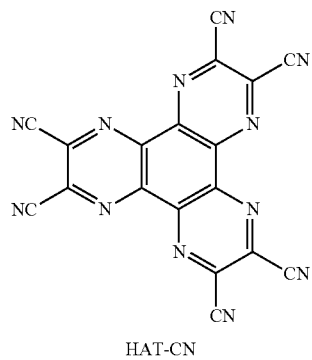

HAT-CN

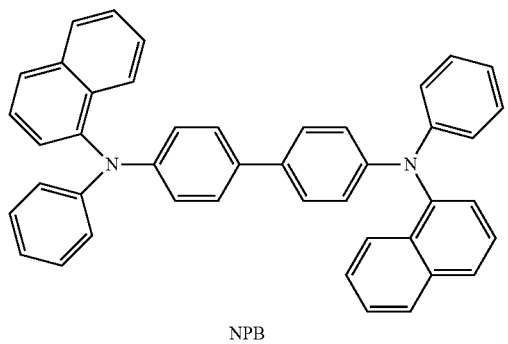

NPB

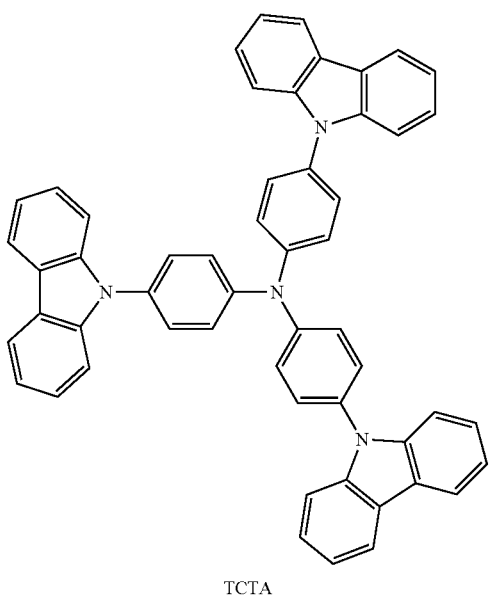

TCTA

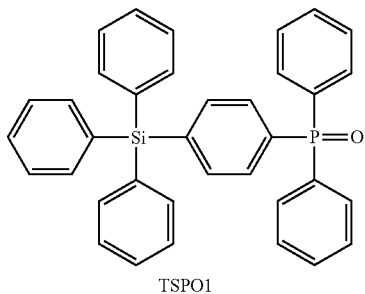

TSPO1

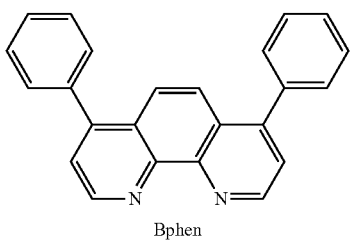

Bphen

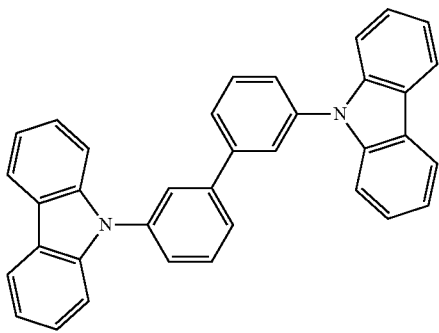

mCBP

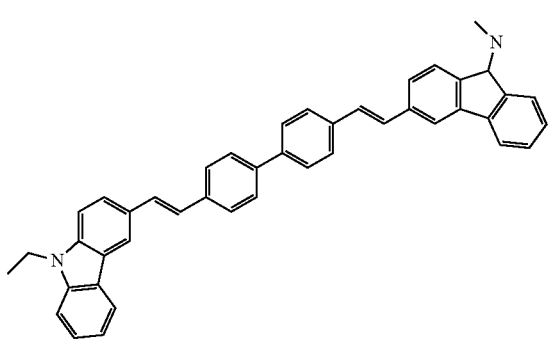

BCzVBi

Example 7

Example 7 differs from Example 6 in that Compound H001 is replaced with Compound H003. The other manufacturing steps are the same as those described in the Example 1.

Example 8

Example 8 differs from Example 6 in that Compound H001 is replaced with Compound H004. The other manufacturing steps are the same as those described in the Example 1.

Example 9

Example 9 differs from Example 6 in that Compound H001 is replaced with Compound H005. The other manufacturing steps are the same as those described in the Example 1.

Example 10

Example 10 differs from Example 6 in that Compound H001 is replaced with Compound H006. The other manufacturing steps are the same as those described in the Example 1.

Example 11

Example 11 differs from Example 6 in that Compound H001 is replaced with Compound H007. The other manufacturing steps are the same as those described in the Example 1.

Example 12

Example 12 differs from Example 6 in that Compound H001 is replaced with Compound H019. The other manufacturing steps are the same as those described in the Example 1.

Example 13

Example 13 differs from Example 6 in that Compound H001 is replaced with Compound H031. The other manufacturing steps are the same as those described in the Example 1.

Comparative Example 1

Comparative Example 1 differs from Example 6 in that Compound is replaced with Compound H031. The other manufacturing steps are the same as those described in the Example 1.

TABLE 2

| | Characteristic Performances of Devices | | | | |
|---|---|---|---|---|---|
| No. | host material | drive voltage (V) | EQE/% | CE (cd/A) | color |
| Example 6 | H001 | 4.05 | 11.4 | 18.2 | blue |
| Example 7 | H003 | 3.96 | 9.8 | 15.8 | blue |
| Example 8 | H004 | 4.15 | 11.2 | 17.5 | blue-green |
| Example 9 | H005 | 4.20 | 12.6 | 19.8 | blue-green |
| Example 10 | H006 | 4.03 | 10.7 | 16.9 | blue |
| Example 11 | H007 | 4.18 | 9.5 | 14.3 | blue |
| Example 12 | H019 | 3.92 | 10.5 | 16.7 | blue |
| Example 13 | H031 | 4.14 | 11.0 | 17.2 | blue |
| Comparative Example 1 | BCzVBi | 4.82 | 4.8 | 7.5 | blue |

It can be seen from Table 2 that the EQE(max) of H001, H003-H007, H019, H031 (doped) devices is significantly higher than that of the comparative device, in which the common blue light-emitting material of BCzVBi was used as the fluorescent dopant. This is mainly attributed to the properties of TADF, i.e., H001, H003-H007, H019 and H031. The triplet excitons, which forbid the transition of the traditional fluorescent molecules (such as BCzVBi), are utilized to emit light, thereby improving device efficiency.

Example 14

Example 14 illustrates an embodiment of the practical application of the compounds according to the present disclosure in an organic light-emitting display panel, in which the compound according the present disclosure is used as a host material of a light-emitting layer, and a fluorescent material or a phosphorescent material is used as a dopant.

A substrate having an ITO film with a thickness of 100 nm was ultrasonically washed with distilled water, acetone, and isoinol, then dried in an oven, and the surface was subjected to UV treatment for 30 minutes. Then the substrate was transferred to a vacuum vapor deposition chamber. The vapor deposition of each layer was carried out under a vacuum of $2 \times 10^{-6}$ Pa. A hole injection layer was formed by depositing 5 nm of HATCN. A hole transmission layer (HTL) was formed by depositing 40 nm of N,N'-diphenyl-N,N'-bis(1-naphthyl)-1,1'biphenyl-4,4''diamine (α-NPD) and then depositing 10 nm of 4,4',4''-tris(carbazol-9-yl)-triphenylamine (TCTA). Compound H001 according to the present disclosure used as a host material of the light-emitting layer, and Ir(ppy)$_3$ used as a dopant of the light-emitting layer, are deposited on the hole transmission layer at the same time, so as to form a light-emitting layer having a thickness of 30 nm. A hole blocking layer (HBL) having a thickness of 5 nm was deposited on the light-emitting layer with 2,2',2''-(1,3,5-Benzinetriyl)-tris(1-phenyl-1-H-benzimidazole (TPBi). An electron transmission layer (ETL) having a thickness of 30 nm was deposited on the hole blocking layer with 1,3,5-tris[(3-pyridyl)-3-phenyl]benzene (TmPyBP). Then, a LiF layer having a thickness of 2.5 nm and an Al layer having a thickness of 100 nm were deposited on the electron transmission layer sequentially, serving as an electron injection layer (EIL) and a cathode respectively, so as to obtain an organic light-emitting display device.

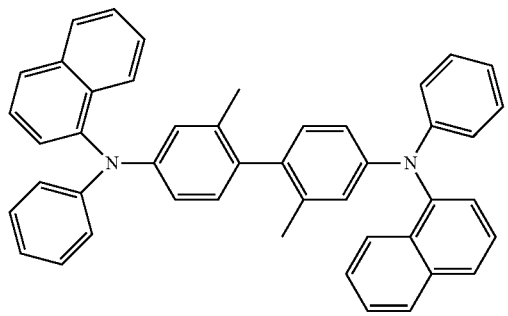

α-NPD

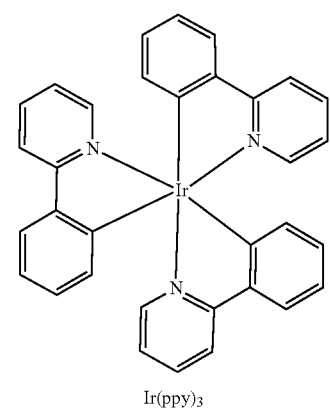

Ir(ppy)$_3$

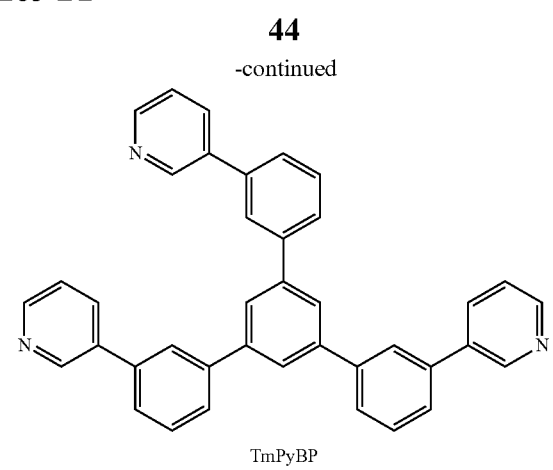

TmPyBP

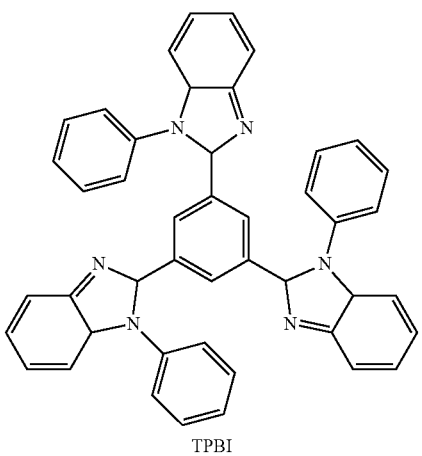

TPBI

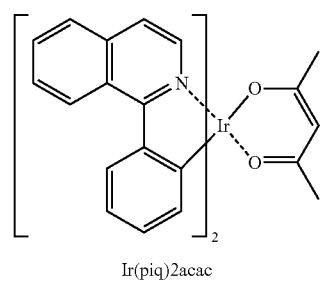

Ir(piq)2acac

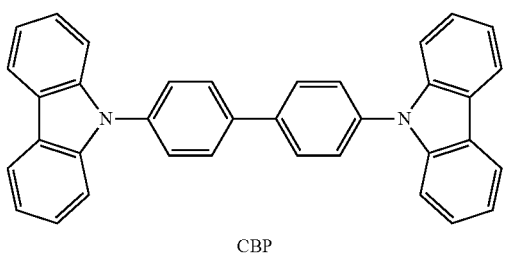

CBP

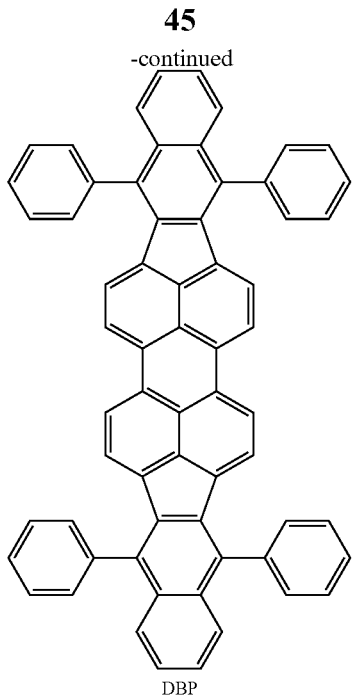

DBP

Example 15

Example 15 differs from Example 14 in that Compound H001 is replaced with Compound H003. The other manufacturing steps are the same as those described in the Example 14.

Example 16

Example 16 differs from Example 14 in that Compound H001 is replaced with Compound H004, and Ir(ppy)$_3$ is replaced with Ir(piq)$_2$acac. The other manufacturing steps are the same as those described in the Example 14.

Example 17

Example 17 differs from Example 14 in that Compound H001 is replaced with Compound H005, and Ir(ppy)$_3$ is replaced with DBP. The other manufacturing steps are the same as those described in the Example 14.

Example 18

Example 18 differs from Example 14 in that Compound H001 is replaced with Compound H006. The other manufacturing steps are the same as those described in the Example 14.

Example 19

Example 19 differs from Example 14 in that Compound H001 is replaced with Compound H007. The other manufacturing steps are the same as those described in the Example 14.

Example 20

Example 20 differs from Example 14 in that Compound H001 is replaced with Compound H019. The other manufacturing steps are the same as those described in the Example 14.

Example 21

Example 21 differs from Example 14 in that Compound H001 is replaced with Compound H031. The other manufacturing steps are the same as those described in the Example 14.

Comparative Example 2

Comparative Example 2 differs from Example 14 in that Compound H001 is replaced with CBP. The other manufacturing steps are the same as those described in the Example 14.

Comparative Example 3

Comparative Example 3 differs from Example 14 in that Compound H001 is replaced with CBP, and Ir(ppy)$_3$ is replaced with DBP. The other manufacturing steps are the same as those described in the Example 14.

Comparative Example 4

Comparative Example 3 differs from Example 14 in that Compound H001 is replaced with CBP, and Ir(ppy)$_3$ is replaced with compound Ir(piq)$_2$acac. The other manufacturing steps are the same as those described in the Example 14.

TABLE 3

Characteristic Performances of Devices

| No. | host material | dopant | drive voltage (V) | EQE/ % | CE (cd/A) | color |
|---|---|---|---|---|---|---|
| Example 14 | H001 | Ir(ppy)$_3$ | 4.08 | 14.4 | 23.8 | green |
| Example 15 | H003 | Ir(ppy)$_3$ | 4.15 | 15.0 | 24.4 | green |
| Example 16 | H004 | Ir(piq)$_2$acac | 3.98 | 12.9 | 21.0 | red |
| Example 17 | H005 | DBP | 4.25 | 10.6 | 17.5 | red |
| Example 18 | H006 | Ir(ppy)$_3$ | 4.02 | 15.4 | 24.8 | green |
| Example 19 | H007 | Ir(ppy)$_3$ | 4.12 | 14.2 | 23.4 | green |
| Example 20 | H019 | Ir(ppy)$_3$ | 4.10 | 15.1 | 25.6 | green |
| Example 21 | H031 | Ir(ppy)$_3$ | 4.19 | 14.7 | 24.3 | green |
| Comparative Example 2 | CBP | Ir(ppy)$_3$ | 4.16 | 12.8 | 20.6 | green |
| Comparative Example 3 | CBP | DBP | 4.32 | 5.8 | 9.8 | red |
| Comparative Example 4 | CBP | Ir(piq)$_2$acac | 4.08 | 10.4 | 17.2 | red |

By using the compounds H001, H003-H007, H019 and H031 according to the present disclosure as the host material, and using Ir(piq)$_2$acac, DBP or Ir(ppy)$_3$ as dopant material, the doped devices achieve the maximum external quantum efficiency of 12.9% (red phosphorescence), 10.6% (red fluorescence) and 15.4% (green light). It indicates that the compounds according to the present disclosure can be used as the host material of the light-emitting material and have a higher external quantum efficiency than the comparative example having $\Delta E_{ST}$ greater than 0.3 eV, in which CBP was used as the host material.

Figure 3:
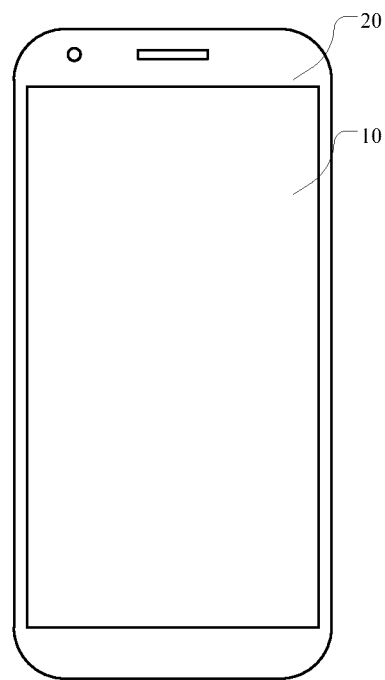
FIG. 3 is a schematic diagram of a display apparatus according to an embodiment of the present disclosure.

The present disclosure also provides a display apparatus including the organic light-emitting display panel as described above. In the present disclosure, the organic light-emitting device can be an OLED, which is used in an organic light-emitting display apparatus. The organic light-emitting device can be a display screen of mobile phone, computer, smart watch, smart car, television, VR or AR helmet display screen, and other smart devices. FIG. 3 is a schematic diagram of a display apparatus according to an embodiment of the present disclosure, in which the reference sign 10 denotes a mobile phone display panel, and the reference sign 20 represents the display apparatus.

The above embodiments of the present disclosure are several preferred embodiments, but not intended to limit the scope of the claims. Any change and modification can be made by those skilled in the art without departing from the scope of the present application. The protection scope of the present disclosure is defined by the claims.

What is claimed is:

1. A compound, according to Formula (1):

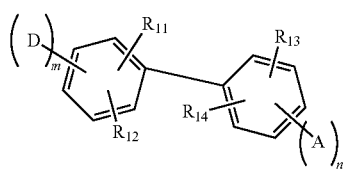

Formula (1)

wherein

D is an electron donor containing a nitrogen atom and is bonded to a benzene ring through the nitrogen atom, and m is an integer selected from 1, 2 or 3;

A is an electron acceptor containing a boron atom and is bonded to a benzene ring through the boron atom, and n is an integer selected from 1, 2 or 3;

the electron acceptor A has a structure represented by any one of the following Formulas (2-1) and (2-2):

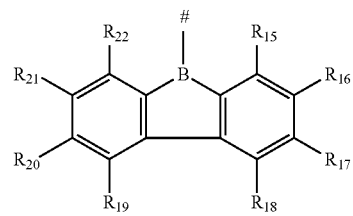

Formula (2-1)

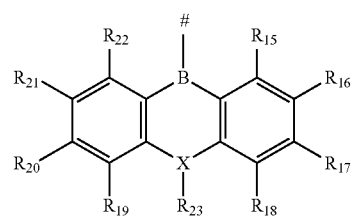

Formula (2-2)

wherein $R_{15}$-$R_{23}$ are each independently selected from the group consisting of a hydrogen atom, C1-C20 alkyl, C1-C20 alkoxy, a substituted or unsubstituted C6-C40 aryl, and a substituted or unsubstituted C3-C40 heteroaryl;

X is selected from the group consisting of a boron atom, an oxygen atom, a sulfur atom, and a nitrogen atom, and $R_{23}$ is absent when X is an oxygen atom, and a sulfur atom;

$R_{11}$, $R_{12}$, $R_{13}$, $R_{14}$ are each independently selected from the group consisting of a hydrogen atom, alkyl, alkoxy, cyano, trifluoromethyl, an electron acceptor A', and a nitrogen-containing electron donor D';

the electron acceptor A' is any one of a carbonyl-containing group, a sulfuryl-containing group, a phosphinyl-containing six-membered phosphorus heterocyclic group, a boron-containing heterocyclic group, and an imido-containing group; and the nitrogen-containing electron donor D' is any one of a substituted or unsubstituted C12-C40 diphenylamino, a substituted or unsubstituted C12-C40 carbazolyl and derivative groups thereof, and a substituted or unsubstituted C13-C40 acridinyl and derivative groups thereof, wherein an energy difference $\Delta E_{st}$ between a lowest singlet energy level S1 of the compound and a lowest triplet energy level T1 of the compound satisfies an equation $\Delta E_{st} = E_{S1} - E_{T1} \leq 0.30$ eV.

2. The compound of claim 1, according to Formula (1-1):

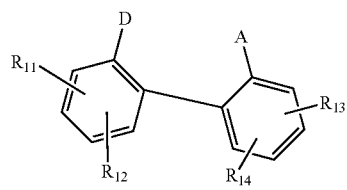

Formula (1-1)

wherein $R_{11}$, $R_{12}$, $R_{13}$ and $R_{14}$ are each independently selected from the group consisting of cyano, trifluoromethyl, alkyl, alkoxy, the electron acceptor A', and the nitrogen-containing electron donor D'.

3. The compound of claim 1, according to Formula (1-2):

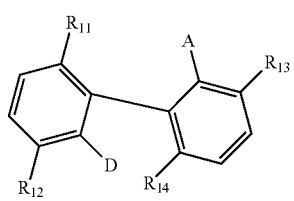

Formula (1-2)

wherein $R_{11}$ and $R_{12}$ are each independently selected from the group consisting of alkyl, alkoxy, and the nitrogen-containing electron donor D'; and $R_{13}$ and $R_{14}$ are each independently selected from the group consisting of alkyl, alkoxy, and electron acceptor A'.

4. The compound of claim 1, according to Formula (1-3):

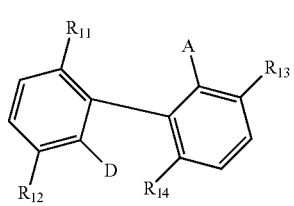

Formula (1-3)

wherein

R₁₁ and R₁₂ are each independently selected from the group consisting of alkyl, alkoxy, and the electron acceptor A'; and R₁₃ and R₁₄ are each independently selected from the group consisting of alkyl, alkoxy, and the nitrogen-containing electron donor D'.

5. The compound according to claim 1, wherein R₁₅-R₂₃ are each independently selected from the group consisting of C1-C6 alkyl, C1-C6 alkoxy, a substituted or unsubstituted C6-C20 aryl, and a substituted or unsubstituted C3-C20 heteroaryl.

6. The compound according to claim 1, wherein D is according to the following formulas:

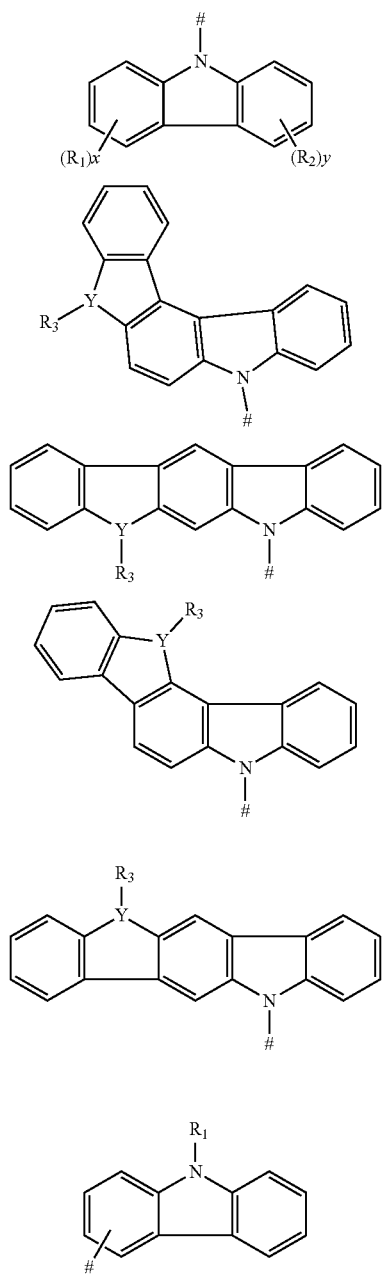

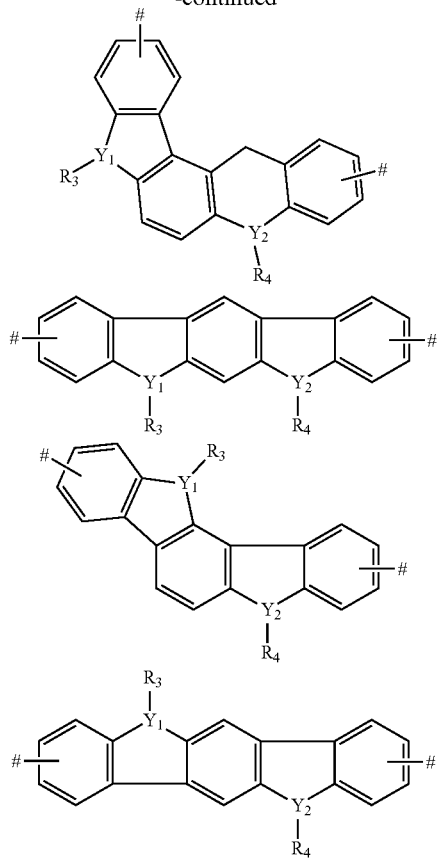

wherein

Y, Y₁ and Y₂ are each independently selected from the group consisting of a carbon atom, a nitrogen atom, an oxygen atom, a sulfur atom, and a silicon atom;

x and y are integers each independently selected from 0, 1, 2 or 3;

\# indicates a bonding position to Formula (1), Formula (1-1), Formula (1-2), or Formula (1-3);

R₁, R₂, R₃, and R₄ are each independently selected from the group consisting of a hydrogen atom, C1-C20 alkyl, C1-C20 alkoxy, a substituted or unsubstituted C6-C40 aryl, a substituted or unsubstituted C4-C40 heteroaryl, a substituted or unsubstituted C12-C40 carbazolyl and derivative groups thereof, a substituted or unsubstituted C12-C40 diphenylamino and derivative groups thereof, a substituted or unsubstituted C13-C40 acridinyl and derivative groups thereof;

when Y is an oxygen atom or a sulfur atom, R₃ is absent;

when Y₁ is an oxygen atom or a sulfur atom, R₃ is absent; and when Y₂ is an oxygen atom or a sulfur atom, R₄ is absent.

7. The compound according to claim 6, wherein D is according to the following groups:

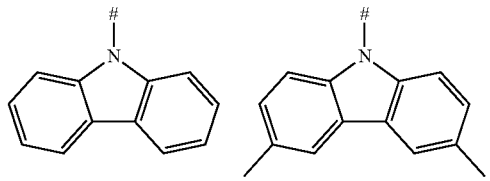

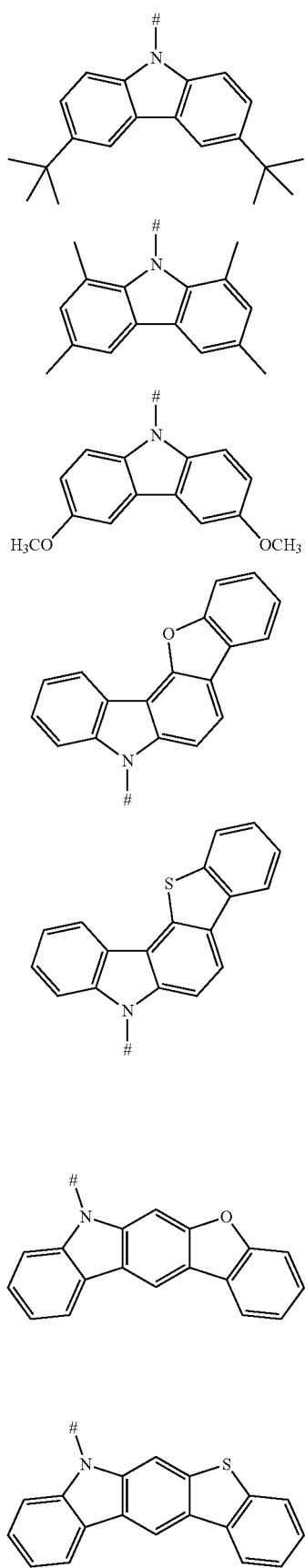
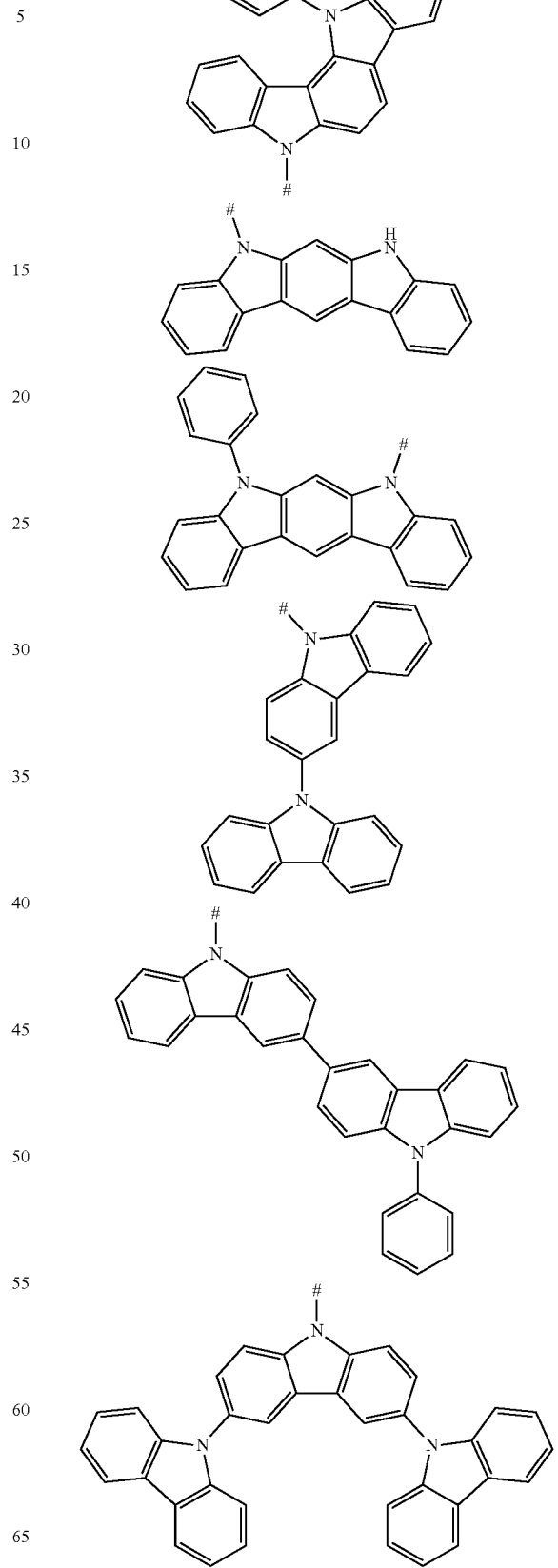

-continued

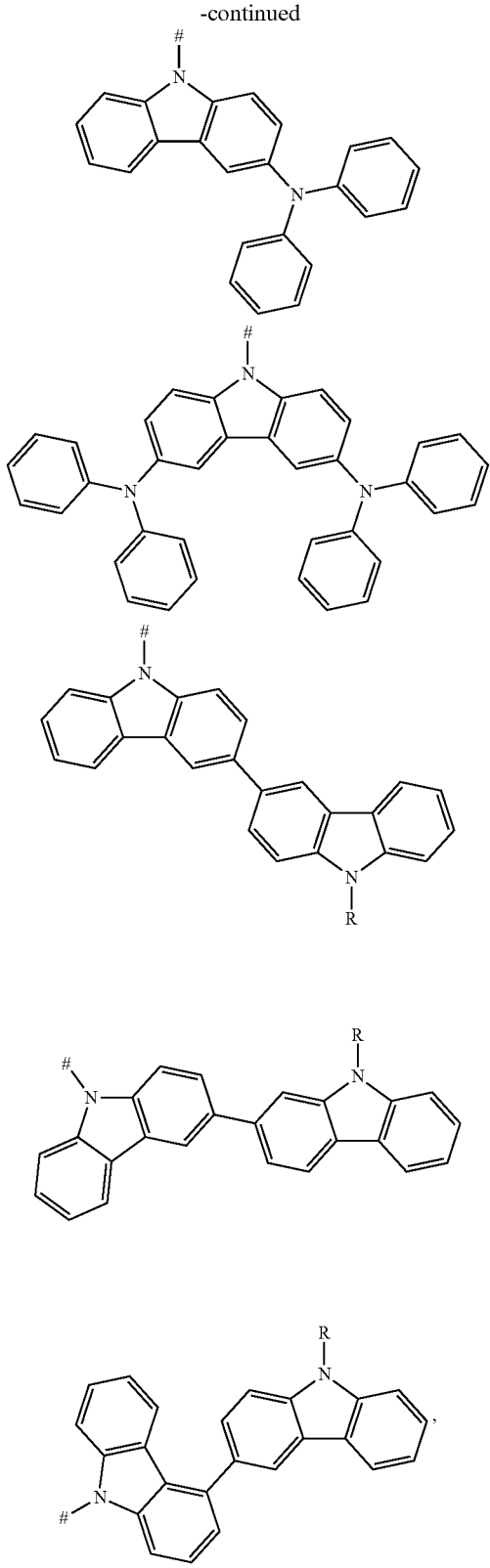

wherein
R is C1-C20 alkyl, C1-C20 alkoxy, C2-C20 alkenyl, C2-C20 alkynyl, C6-C40 aryl, C4-C40 heteroaryl; and
# is a bonding position to Formula (1).

8. The compound according to claim 1, wherein D is according to the following formulas:

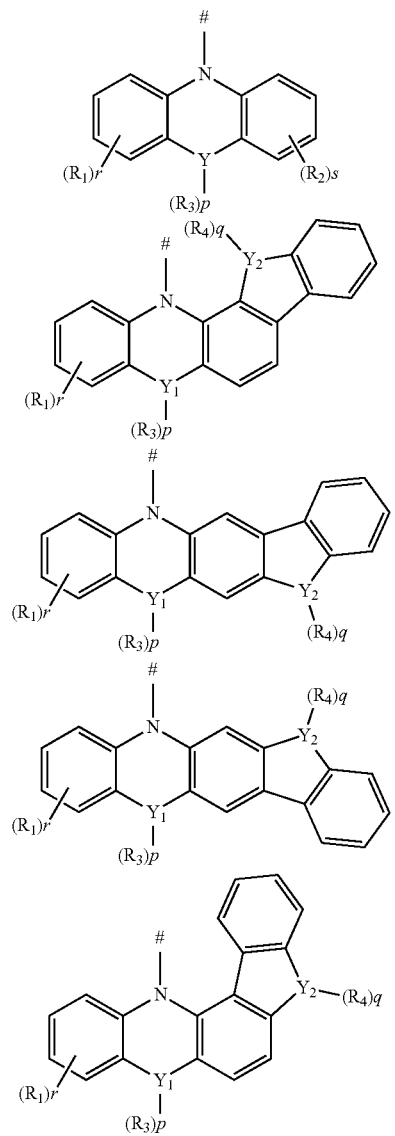

wherein
Y, $Y_1$ and $Y_2$ are each independently selected from the group consisting of a carbon atom, a nitrogen atom, an oxygen atom, a sulfur atom, and a silicon atom;
# indicates a bonding position to Formula (1);
r and s are integers each independently selected from 0, 1, 2 or 3, p and q are integers each independently selected from 0, 1 or 2;
$R_1$, $R_2$, $R_3$, and $R_4$ are each independently selected from the group consisting of a hydrogen atom, C1-C20 alkyl, C1-C20 alkoxy, a substituted or unsubstituted C6-C40 aryl, a substituted or unsubstituted C4-C40 heteroaryl, a substituted or unsubstituted C12-C40 carbazolyl and derivative groups thereof, a substituted or unsubstituted C12-C40 diphenylamino and derivative groups thereof, a substituted or unsubstituted C13-C40 acridinyl and derivative groups thereof;
when Y, $Y_1$ or $Y_2$ is an oxygen atom or a sulfur atom, p=0 or q=0;

when Y, Y$_1$ or Y$_2$ is a nitrogen atom, p and q are each independently 0 or 1; and when Y, Y$_1$ or Y$_2$ is a carbon atom or a silicon atom, p and q are integers each independently selected from 0, 1, or 2.

9. The compound according to claim 8, wherein D is according to the following groups:

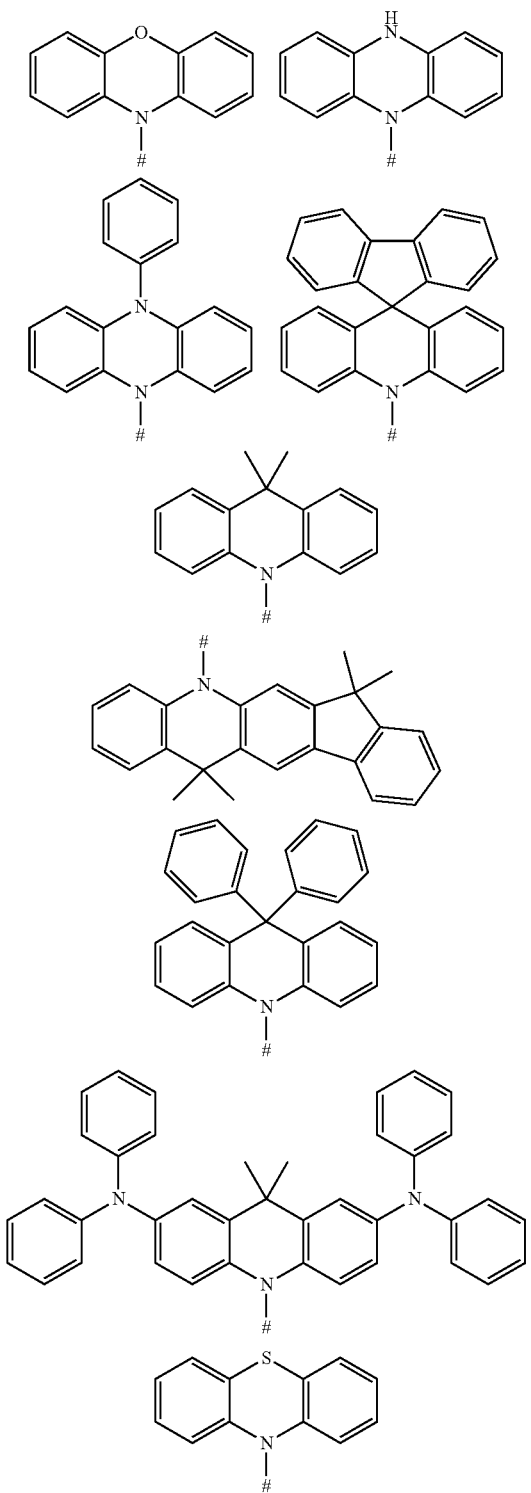

-continued

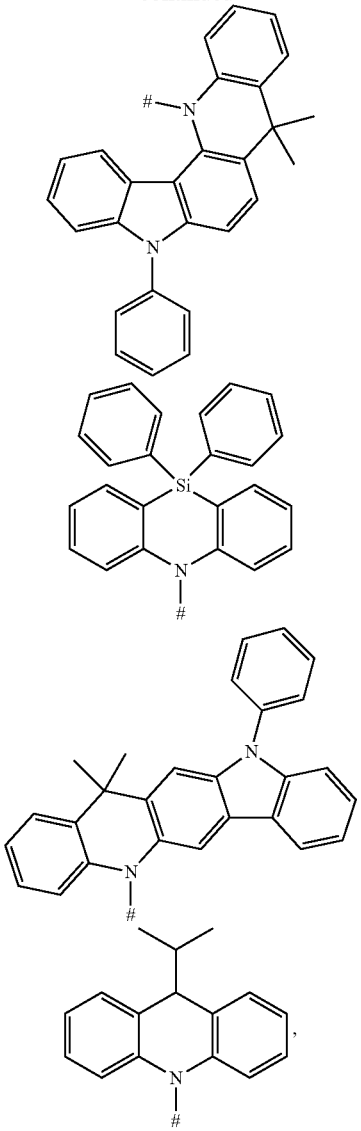

wherein # indicates a bonding position to Formula (1).

10. The compound according to claim 1, wherein D is according to the following formula:

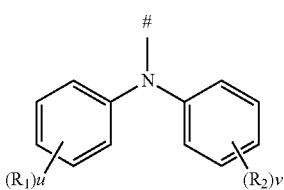

wherein

R$_1$, R$_2$ are each independently selected from the group consisting of a hydrogen atom, C1-C20 alkyl, C1-C20 alkoxy, a substituted or unsubstituted C6-C40 aryl, a substituted or unsubstituted C4-C40 heteroaryl, a substituted or unsubstituted C12-C40 carbazolyl and derivative groups thereof, a substituted or unsubstituted C12-C40 diphenylamino and derivative groups thereof, a substituted or unsubstituted C13-C40 acridinyl and derivative groups thereof;

u and v are integers each independently selected from 0, 1, 2 or 3; and # indicates a bonding position to Formula (1), Formula (1-1), Formula (1-2), or Formula (1-3).

11. The compound according to claim 10, wherein D is according to the following groups:

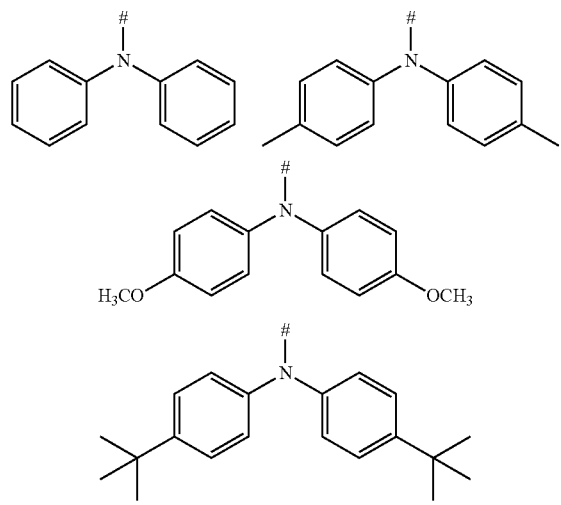

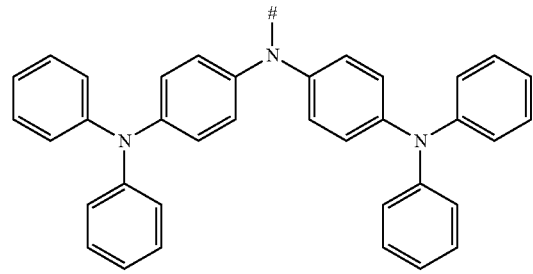

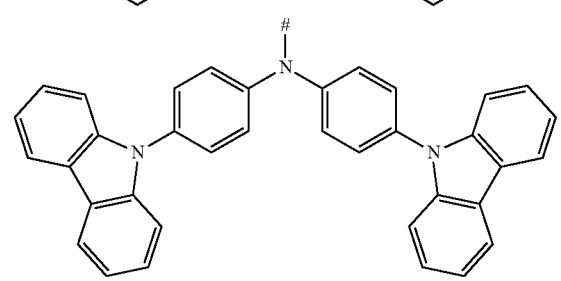

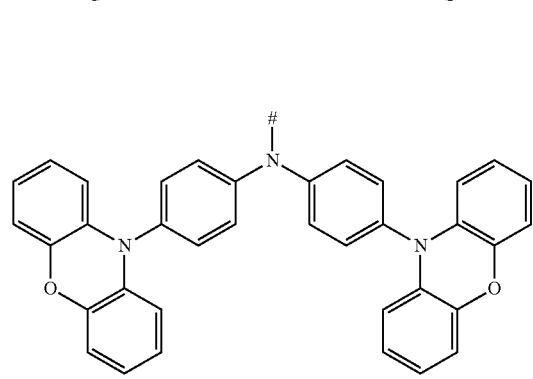

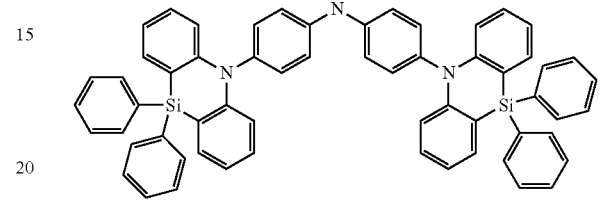

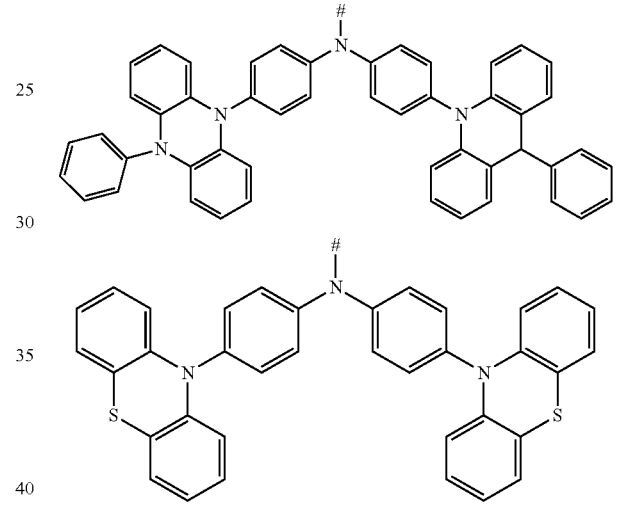

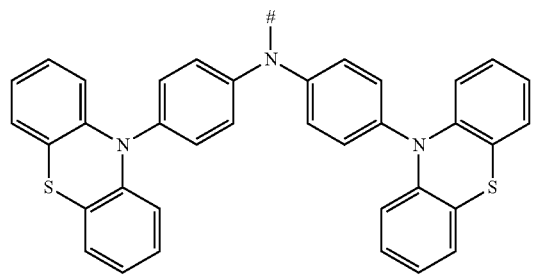

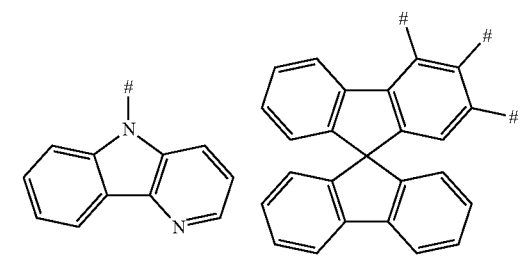

wherein # indicates a bonding position to Formula (1).

12. The compound according to claim 1, wherein D is according to the following groups:

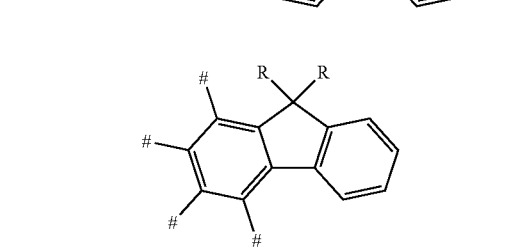

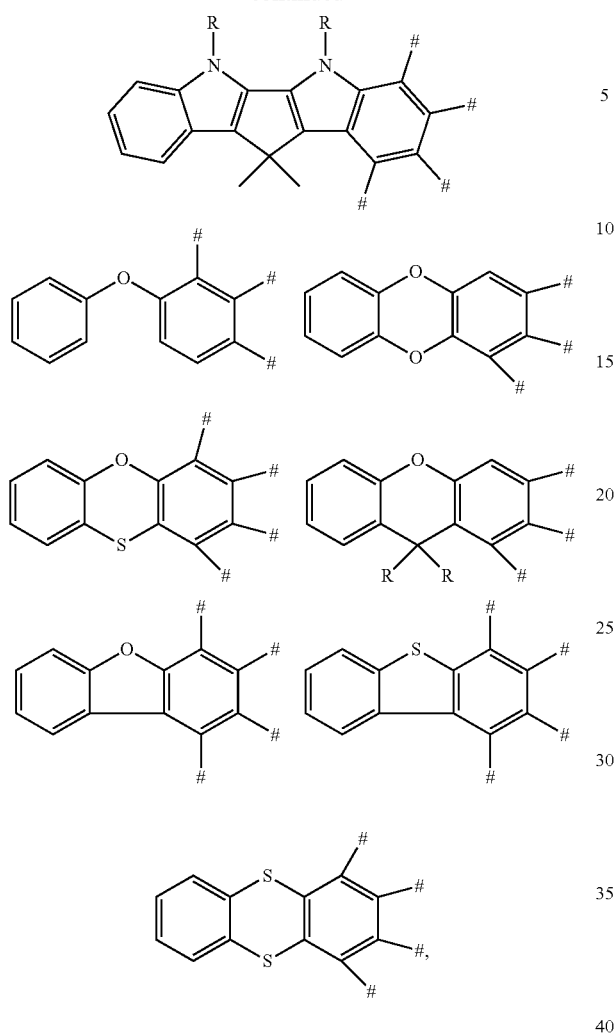
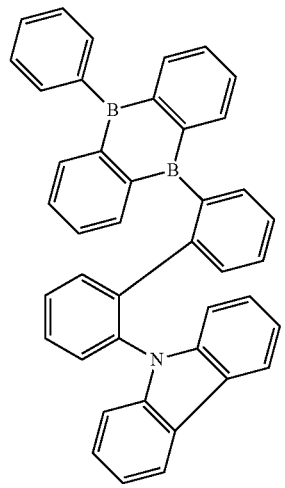
wherein # indicates a bonding position to Formula (1), Formula (1-1), Formula (1-2), or Formula (1-3).
13. The compound of claim 1, according to the following compounds:
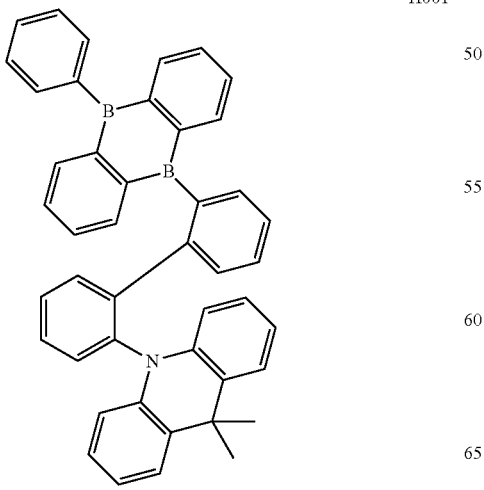
H001
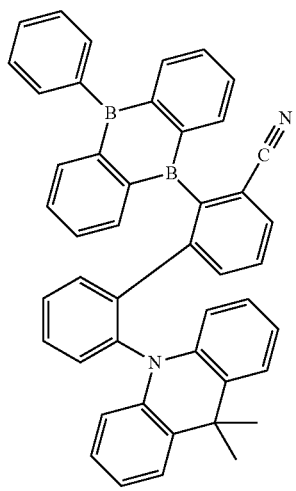
H002
H003
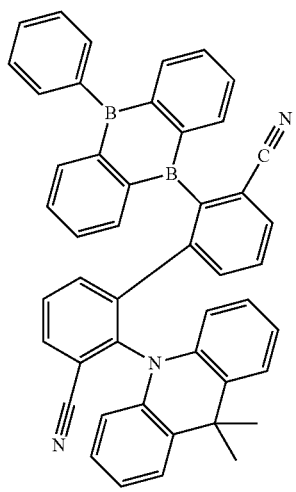
H004

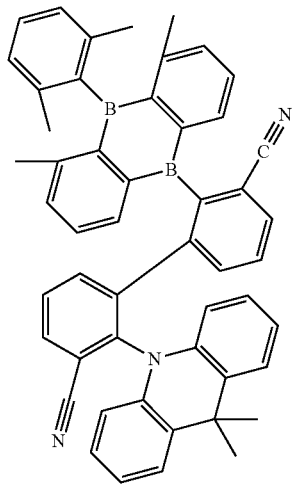
H005
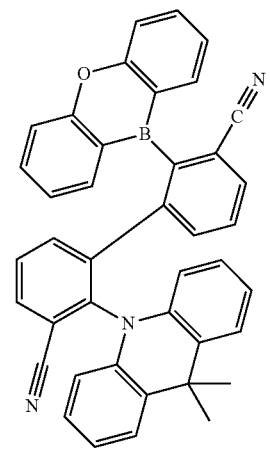
H006
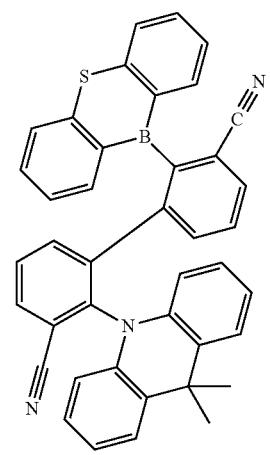
H007
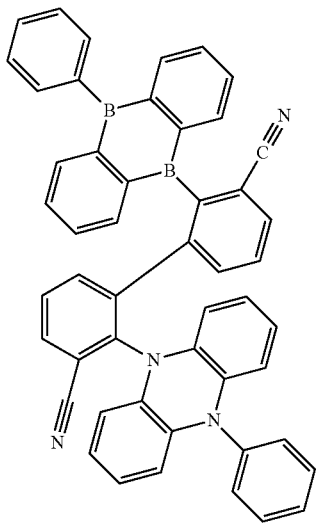
H008
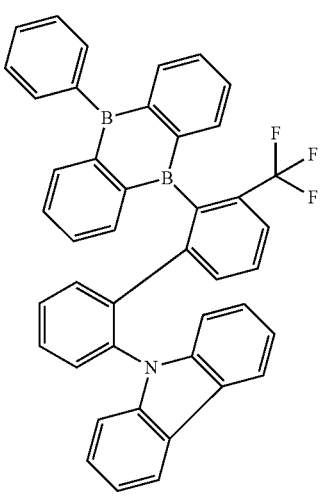
H009
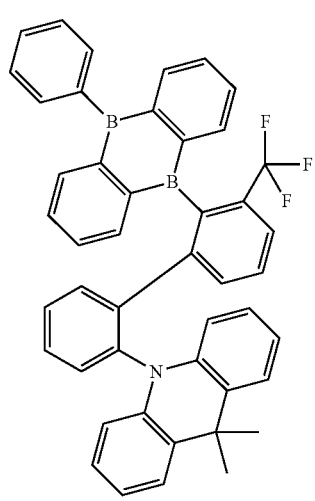
H010

-continued
H011
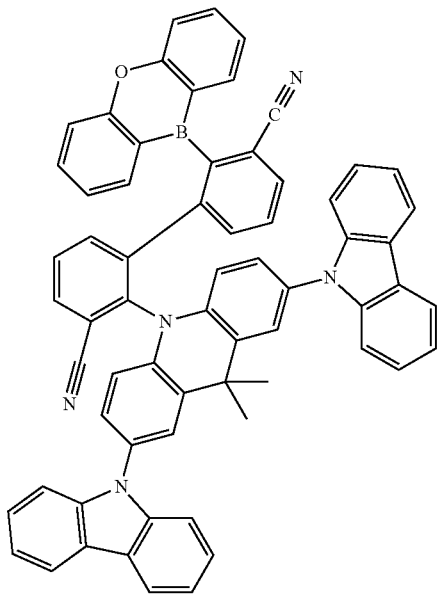
H012
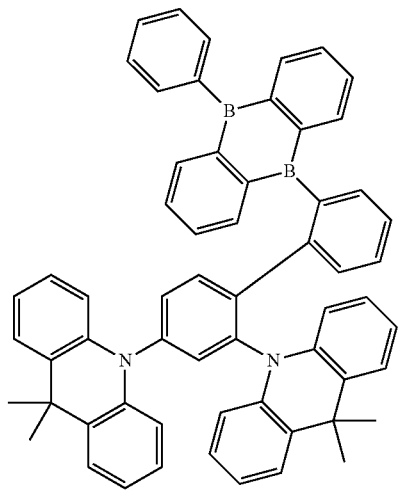
H013
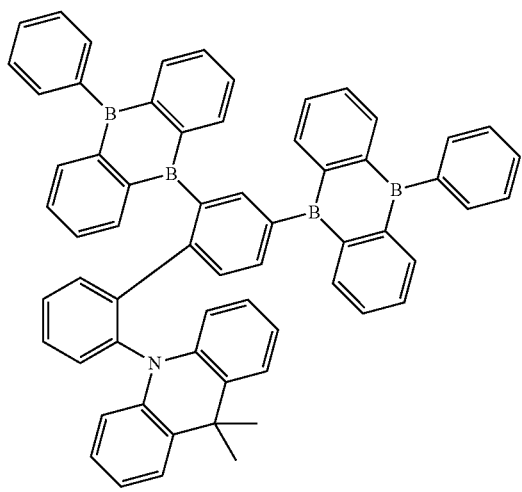
-continued
H014
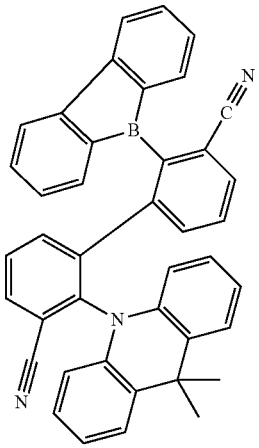
H015
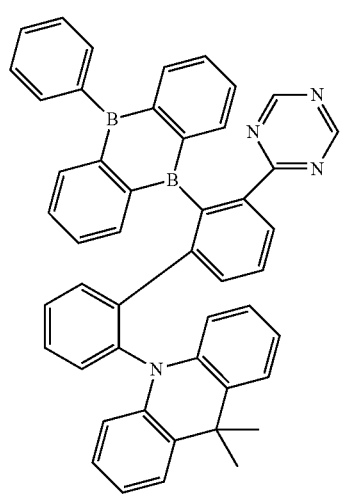
H016
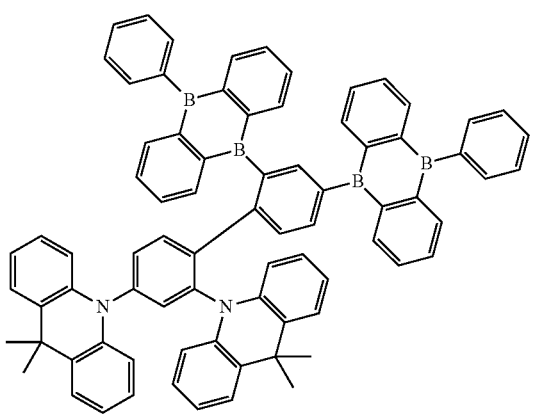

-continued
H017
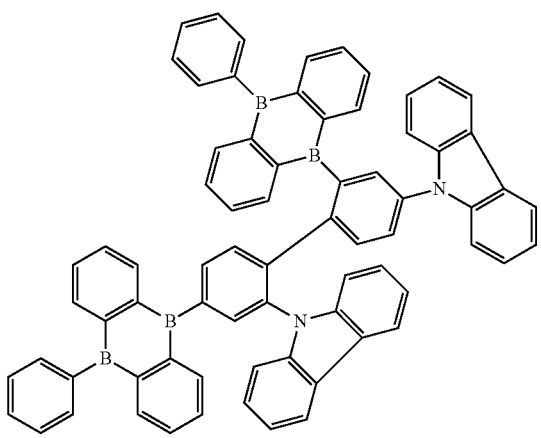
H018
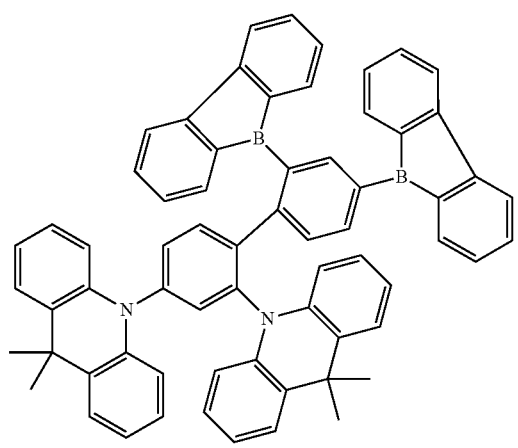
H019
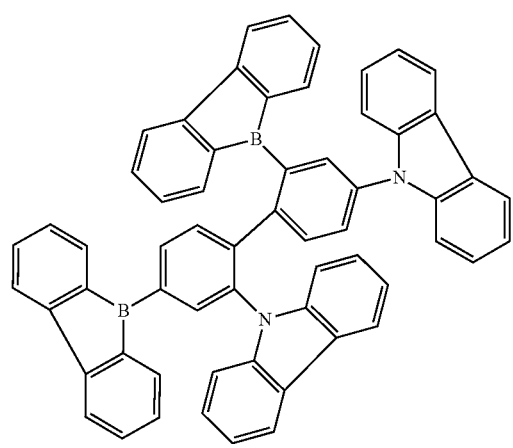
H020
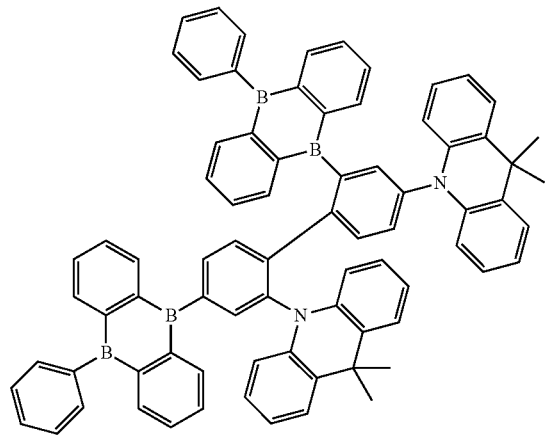
H021
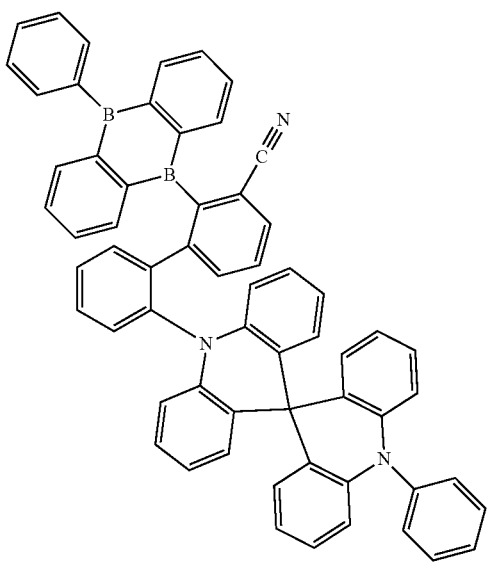
H022
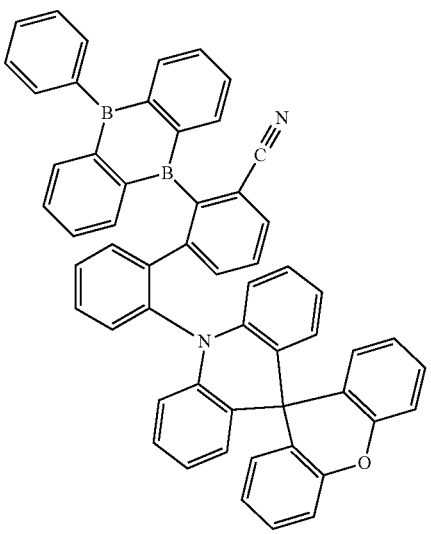

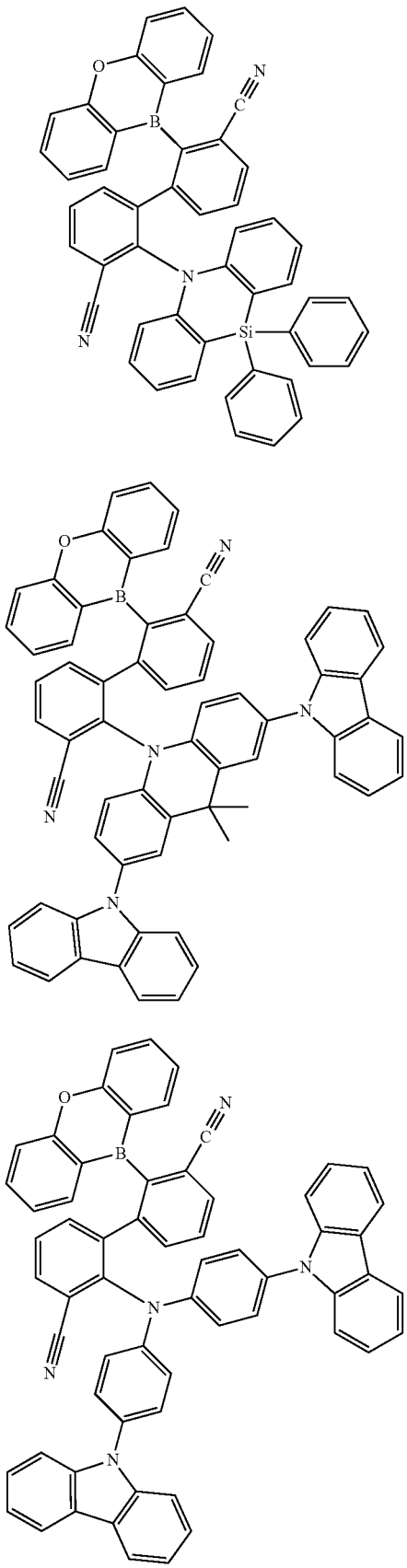
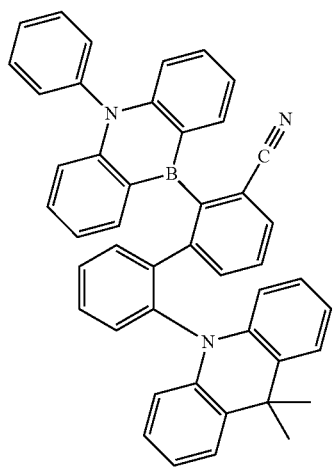
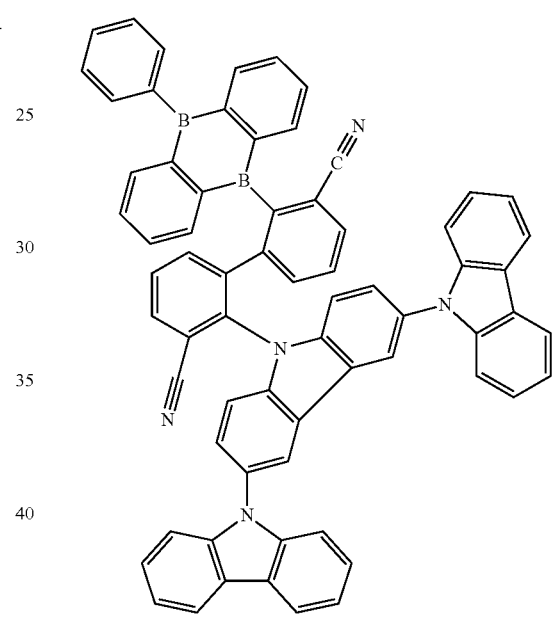
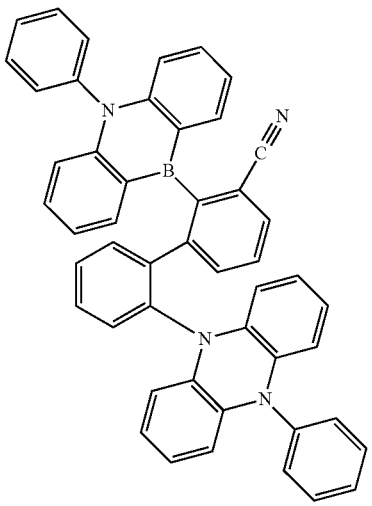

H029

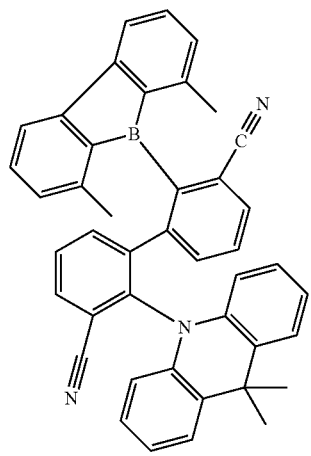

H031

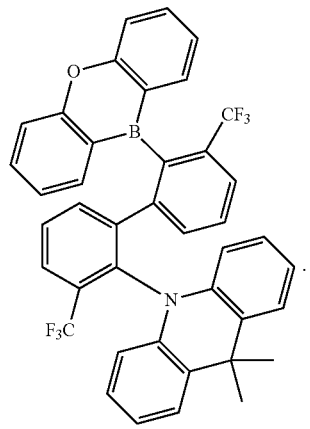

H030

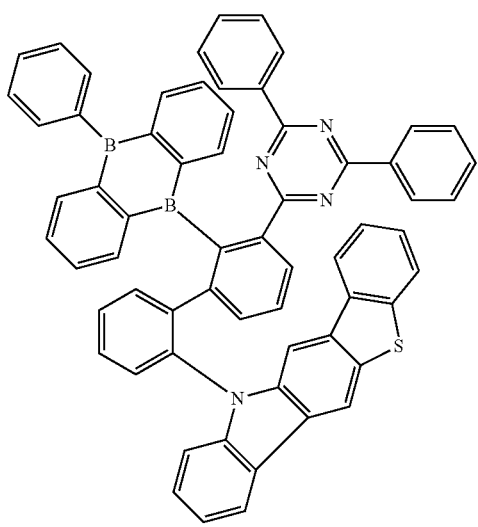

14. A display panel, comprising:
an anode;
a cathode; and
a light-emitting layer disposed between the anode and the cathode,
wherein a light-emitting material of the light-emitting layer comprises a host material and a guest material, the host material or the guest material being the compound according to claim 1.

15. The display panel according to claim 14, wherein the guest material is the compound according to claim 1;
wherein an energy difference between a HOMO level of the guest material and a HOMO level of the host material is less than 0.6 eV, or an energy difference between a LUMO level of the guest material and a LUMO level of the host material is less than 0.6 eV.

16. The display panel according to claim 14, wherein the host material is the compound of claim 1, and the guest material is a fluorescent material, a thermally activated delayed fluorescent material, or a phosphorescent light-emitting material;
wherein an energy difference between a HOMO energy level of the host material and a HOMO energy level of the guest material is less than 0.6 eV, or an energy difference between a LUMO energy level of the guest material and a LUMO energy level of the host material is less than 0.6 eV.

17. The display panel according to claim 14, wherein a singlet energy level of the host material is higher than a singlet energy level of the guest material, and an energy difference between the singlet energy level of the host material and the singlet energy level of the guest material is less than 1.0 eV.

18. A display apparatus, comprising the display panel according to claim 14.

* * * * *